US012027552B2

United States Patent
Lee et al.

(10) Patent No.: US 12,027,552 B2
(45) Date of Patent: Jul. 2, 2024

(54) IMAGE SENSOR HAVING HIGH PIXEL INTEGRATION

(71) Applicant: SAMSUNG ELECTRONICS CO., LTD., Suwon-si (KR)

(72) Inventors: Kangmin Lee, Suwon-si (KR); Junetaeg Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 322 days.

(21) Appl. No.: 17/323,449

(22) Filed: May 18, 2021

(65) Prior Publication Data

US 2022/0109020 A1 Apr. 7, 2022

(30) Foreign Application Priority Data

Oct. 6, 2020 (KR) .................. 10-2020-0128518

(51) Int. Cl.
  *H01L 27/146* (2006.01)
  *H01L 27/148* (2006.01)

(52) U.S. Cl.
  CPC .. *H01L 27/14627* (2013.01); *H01L 27/14621* (2013.01); *H01L 27/14685* (2013.01); *H01L 27/14831* (2013.01)

(58) Field of Classification Search
  CPC ........... H01L 27/14605; H01L 27/1461; H01L 27/14612; H01L 27/14627; H01L 27/14631; H01L 27/1464; H01L 27/14643; H01L 27/14645; H01L 27/14685; H04N 25/11

See application file for complete search history.

(56) References Cited

U.S. PATENT DOCUMENTS

| | | | |
|---|---|---|---|
| 8,097,890 B2 | 1/2012 | Qian et al. | |
| 8,119,437 B2 | 2/2012 | Kim et al. | |
| 9,215,430 B2 | 12/2015 | Wu | |
| 10,276,615 B2 | 4/2019 | Shibuta | |
| 2018/0026065 A1 | 1/2018 | Hsieh et al. | |
| 2020/0083268 A1* | 3/2020 | Kim ................ | H01L 27/14685 |
| 2021/0233947 A1* | 7/2021 | Zang ................ | H01L 27/14605 |
| 2023/0018370 A1* | 1/2023 | Asatsuma ........... | H04N 25/702 |

FOREIGN PATENT DOCUMENTS

KR 10-09228639 B1 11/2009
KR 10-2011-0079336 A 7/2011

* cited by examiner

*Primary Examiner* — Nelson Garces
(74) *Attorney, Agent, or Firm* — Sughrue Mion, PLLC

(57) ABSTRACT

An image sensor includes a substrate that has a first pixel region and a second pixel region and a microlens layer on a first surface of the substrate. The microlens layer includes a first lens pattern on the first pixel region of the substrate; and a second lens pattern on the second pixel region of the substrate. A width of the first pixel region is greater than a width of the second pixel region, and a height of the first lens pattern is greater than a height of the second lens pattern.

16 Claims, 13 Drawing Sheets

IMAGE SENSOR HAVING HIGH PIXEL INTEGRATION

CROSS-REFERENCE TO RELATED APPLICATION

This U.S. nonprovisional application claims priority under 35 U. S. C. § 119 to Korean Patent Application No. 10-2020-0128518 filed on Oct. 6, 2020 in the Korean Intellectual Property Office, the disclosure of which is hereby incorporated by reference in its entirety.

BACKGROUND

1. Field

The present disclosure relates to an image sensor, and more particularly, to a microlens layer of an image sensor and a method of forming the same.

2. Description of Related Art

An image sensor is a device to convert optical images into electrical signals. An image sensor may be classified into a charge coupled device (CCD) type and a complementary metal oxide semiconductor (CMOS) type. A CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

It is an aspect to provide an image sensor with improved image quality.

According to an aspect of some example embodiments, there is provided an image sensor comprising a substrate that has a first pixel region and a second pixel region; and a microlens layer on a first surface of the substrate. The microlens layer may include a first lens pattern on the first pixel region of the substrate; and a second lens pattern on the second pixel region of the substrate. A width of the first pixel region may be greater than a width of the second pixel region. A height of the first lens pattern may be greater than a height of the second lens pattern.

According to another aspect of some example embodiments, there is provided an image sensor comprising a substrate that has a first pixel region and a second pixel region whose width is different from a width of the first pixel region; a plurality of photoelectric conversion regions that are correspondingly in the first and second pixel regions of the substrate; and a microlens layer on a first surface of the substrate and covering the first and second pixel regions of the substrate. The microlens layer may include a first lens pattern on the first pixel region of the substrate, the first lens pattern having a first curved surface; and a second lens pattern on the second pixel region of the substrate, the second lens pattern having a second curved surface. At a level of a location where the first curved surface meets the second curved surface, a width of the first lens pattern may be greater than a width of the second lens pattern. A height of the first lens pattern may be greater than a height of the second lens pattern.

According to yet another aspect of some example embodiments, there is provided an image sensor comprising a substrate that has a first pixel region and a second pixel region; a plurality of photoelectric conversion regions that are correspondingly in the first and second pixel regions of the substrate; an isolation pattern in the substrate and between the photoelectric conversion regions; a color filter on a first surface of the substrate; a microlens layer on the color filter; a first gate pattern on the first pixel region of the substrate and on a second surface of the substrate; a second gate pattern on the second pixel region of the substrate and on the second surface of the substrate; and a wiring layer on the second surface of the substrate and covering the first and second gate patterns. The substrate may include a first floating diffusion region on the first pixel region of the substrate; and a second floating diffusion region on the second pixel region of the substrate. The microlens layer may include a first lens pattern on the first pixel region of the substrate; a second lens pattern on the second pixel region of the substrate; and a planarized layer between the color filter and the first lens pattern and between the color filter and the second lens pattern. The first and second lens patterns may be on the color filter. A width of the first pixel region may be greater than a width of the second pixel region. A height of the first lens pattern may be greater than a height of the second lens pattern.

BRIEF DESCRIPTION OF THE DRAWINGS

The above and other aspects will be more clearly understood from the following detailed description, taken in conjunction with the accompanying drawings, in which.

DETAILED DESCRIPTION

Figure 1:
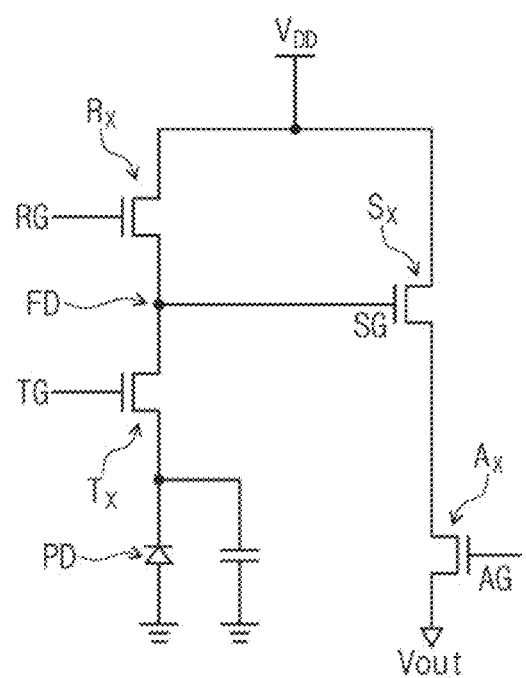
FIG. 1 illustrates a circuit diagram showing a pixel of an image sensor according to some example embodiments.

In this description, like reference numerals may indicate like components. The drawings are not necessarily to scale and some dimensions may be exaggerated to improve legibility and ease of description. The following will now describe an image sensor according to some example embodiments.

FIG. 1 illustrates a circuit diagram showing a pixel of an image sensor according to some example embodiments.

Referring to FIG. 1, each of pixels of an image sensor may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may respectively include a transfer gate TG, a source follower gate SG, a reset gate RG, and a selection gate AG.

The photoelectric conversion region PD may be a photodiode that includes an n-type impurity region and a p-type impurity region. A floating diffusion region FD may serve as a drain of the transfer transistor Tx. The floating diffusion region FD may also serve as a source of the reset transistor Rx. The floating diffusion region FD may be electrically connected to the source follower gate SG of the source follower transistor Sx. The source follower transistor Sx may be connected to the selection transistor Ax.

An operation of the image sensor will be explained below with reference to FIG. 1. First, a power voltage $V_{DD}$ may be applied to a drain of the reset transistor Rx and a drain of the source follower transistor Sx under a light-blocked state, such that the reset transistor Rx may be turned on to discharge charges that remain on the floating diffusion region FD. Thereafter, when the reset transistor Rx is turned off and external light is incident on the photoelectric conversion region PD, electron-hole pairs may be generated from the photoelectric conversion region PD. Holes may be transferred to and accumulated on a p-type impurity region of the photoelectric conversion region PD, and electrons may be transferred to and accumulated on an n-type impurity region of the photoelectric conversion region PD. When the transfer transistor Tx is turned on, charges such as electrons and holes may be transferred to and accumulated on the floating diffusion region FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A wiring line may be electrically connected to one or more of the transfer gate TG, the source follower gate SG, the reset gate RG, and the selection gate AG. The wiring line may be configured to apply the power voltage $V_{DD}$ to the drain of the reset transistor Rx or the drain of the source follower transistor Sx. The wiring line may include a column line connected to the selection transistor Ax. The wiring line may be a conductive structure 830 which will be discussed below in FIG. 2B.

FIG. 1 shows by way of example a pixel that includes one photoelectric conversion region PD and four transistors Tx, Rx, Ax, and Sx, but example embodiments are not limited thereto. For example, in some embodiments, the pixel may be provided in plural, and neighboring pixels may share one of the reset transistor Rx, the source follower transistor Sx, and the selection transistor Ax. Therefore, the image sensor may increase in integration.

Figure 2A:
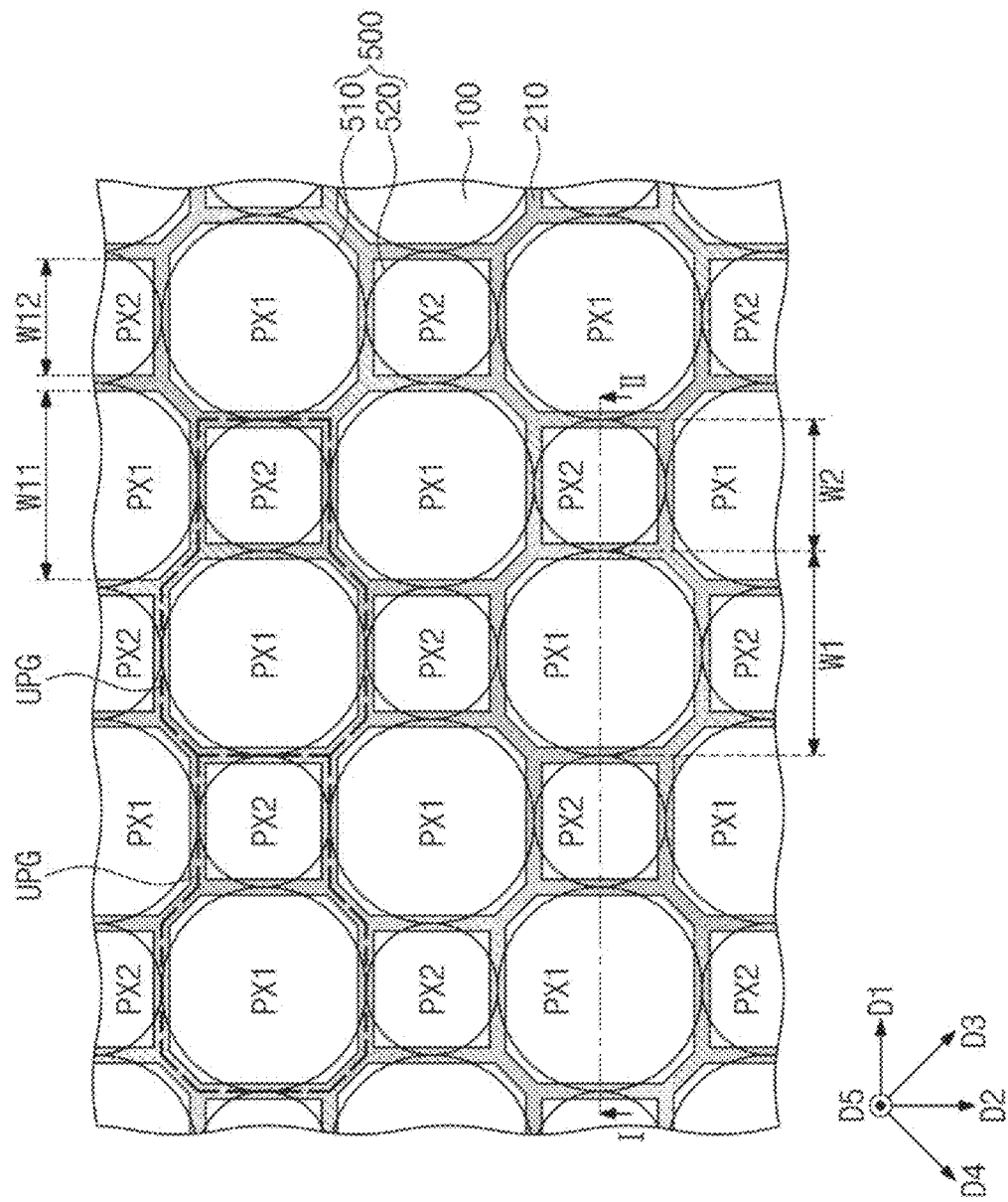
FIG. 2A illustrates a plan view showing an image sensor according to some example embodiments.
Figure 2B:
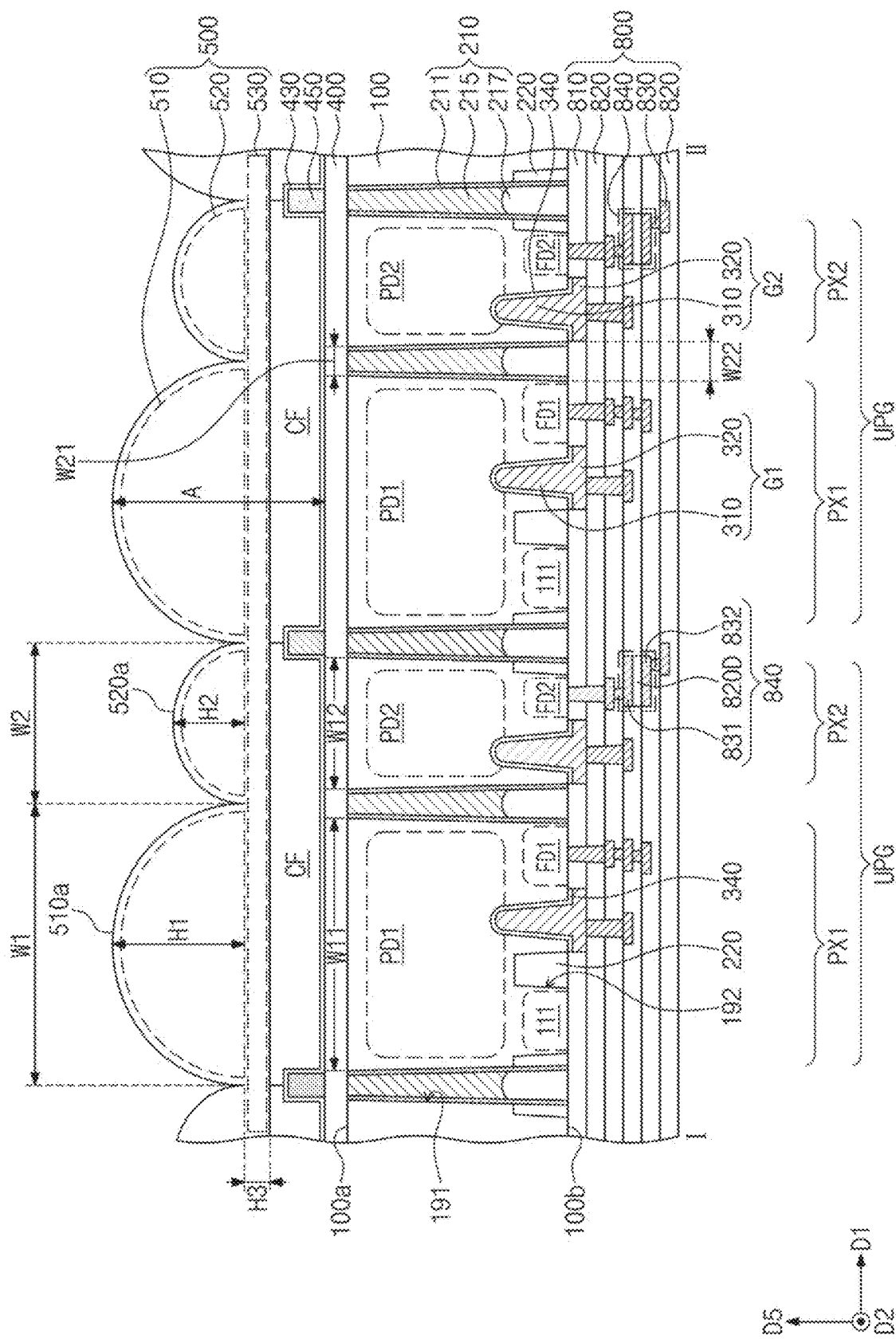
FIG. 2B illustrates a cross-sectional view taken along line I-II of FIG. 2A.

FIG. 2A illustrates a plan view showing an image sensor according to some example embodiments. FIG. 2B illustrates a cross-sectional view taken along line I-II of FIG. 2A.

Referring to FIGS. 2A and 2B, an image sensor may include a substrate 100, an isolation pattern 210, a device isolation pattern 220, a first gate pattern G1, a second gate pattern G2, a wiring layer 800, a dielectric layer 400, a protective layer 430, a fence pattern 450, color filters CF, and a microlens layer 500.

When viewed in plan view, the substrate 100 may include a pixel array area and an edge area. When viewed in plan view, the pixel array area may be disposed on a central portion of the substrate 100. The edge area may surround the pixel array area. Pad terminals (not shown) may be provided on the edge area. The pixel array area may include a plurality of unit pixel groups UPG, and each of the unit pixel groups UPG may include a first pixel region PX1 and a second pixel region PX2. The unit pixel groups UPG may constitute an array. The pixels discussed with reference to FIG. 1 may be correspondingly formed on the first and second pixel regions PX1 and PX2 of the substrate 100. For example, components of the pixel may be provided on each of the first and second pixel regions PX1 and PX2. Each of the first and second pixel regions PX1 and PX2 may output a corresponding photoelectric conversion signal from incident light. According to some example embodiments, the first pixel region PX1 may serve as a primary pixel, and the second pixel region PX2 may serve as a subsidiary pixel. For example, when the image sensor operates, on each of the unit pixel groups UPG, a photoelectric conversion signal that is output from the second pixel region PX2 may be used to correct a photoelectric conversion signal that is output from the first pixel region PX1. Therefore, the image sensor may increase in optical properties and sensing accuracy. The second pixel region PX2, however, is not limited to the subsidiary pixel function mentioned above.

A plurality of first pixel regions PX1 may be two-dimensionally arranged in rows and columns. The rows may be parallel to a first direction D1. The columns may be parallel to a second direction D2. The first pixel regions PX1 may be arranged in a first diagonal direction D3. The first pixel regions PX1 may be arranged in a second diagonal direction D4. In this description, the first direction D1 may be parallel to a first surface 100a of the substrate 100. The second direction D2 may be parallel to the first surface 100a and different from the first direction D1. For example, in some embodiments, the second direction D2 may be substantially orthogonal to the first direction D1. The first diagonal direction D3 may be parallel to the first surface 100a of the substrate 100, and may intersect the first and second directions D1 and D2. For example, in some embodiments, the first diagonal direction D3 and the first direction D1 may make an angle of about 45 degrees with each other, and the first diagonal direction D3 and the second direction D2 may make an angle of about 45 degrees with each other. The second diagonal direction D4 may be parallel to the first surface 100a, and may intersect the first direction D1, the second direction D2, and the first diagonal direction D3. For example, in some embodiments, the second diagonal direction D4 may be substantially orthogonal to the first diagonal direction D3. A third direction D5 may intersect the first direction D1, the second direction D2, the first diagonal direction D3, and the second diagonal direction D4. For example, in some embodiments, the third direction D5 may be substantially perpendicular to the first surface 100a of the substrate 100.

In some embodiments, each of the first pixel regions PX1 may have an octagonal shape when viewed in plan view. Each of the first pixel regions PX1 may have a first width W11. The first width W11 may be measured in the first direction D1, and may be a width at the first surface 100a of the substrate 100. The first width W11 may correspond to an interval between two opposing sidewalls of isolation patterns 210 which will be discussed below.

When viewed in plan view, each of a plurality of second pixel regions PX2 may be surrounded by four adjacent first pixel regions PX1. When viewed in plan view, the second pixel regions PX2 may be two-dimensionally arranged along the first and second directions D1 and D2. When viewed in the first direction D1, the second pixel regions PX2 may be correspondingly disposed between the first pixel regions PX1. In such a configuration, the first pixel regions PX1 and the second pixel regions PX2 may be alternately disposed in the first direction D1. When viewed in the second direction D2, the second pixel regions PX2 may be correspondingly disposed between the first pixel regions PX1. In such a configuration, the first pixel regions PX1 and the second pixel regions PX2 may be alternately disposed in the second direction D2.

In some embodiments, each of the second pixel regions PX2 may have a tetragonal shape when viewed in plan view. Sizes of the second pixel regions PX2 may be less than sizes of the first pixel regions PX1. For example, each of the second pixel regions PX2 may have a second width W12. The second width W12 may be less than the first width W11. The second width W12 may be measured in the first direction D1. The second width W12 may correspond to an interval between two opposing sidewalls of isolation patterns 210 which will be discussed below, and may be measured on the first surface 100a of the substrate 100. In addition, widths of the second pixel regions PX2 in the second direction D2 may be less than widths of the first pixel regions PX1 in the second direction D2. In this description, widths of two components may be compared with each other in the same direction at the same level.

According to some example embodiments, planar shapes and the first widths W11 of the first pixel regions PX1 may be adjusted, and planar widths and the second widths of the second pixel regions PX2 may be adjusted in order that that the first and second pixel regions PX1 and PX2 may be disposed at high integration density. Therefore, the image sensor may increase in optical properties.

The substrate 100 may have a first surface 100a and a second surface 100b that face each other. The first surface 100a may be a rear surface of the substrate 100, and the second surface 100b may be a front surface of the substrate 100. The substrate 100 may receive light incident on the first surface 100a. The substrate 100 may be a semiconductor substrate, such as a silicon substrate or a silicon-on-insulator (SOI) substrate. The semiconductor substrate may be, for example, a silicon substrate, a germanium substrate, or a silicon-germanium substrate. The substrate 100 may further include a III-group element. The III-group element may be an impurity having a first conductivity type. The substrate 100 may include first conductivity type impurities and may thus have the first conductivity type. For example, the first conductivity type impurities may include p-type impurities, such as one or more of aluminum (Al), boron (B), indium (In), and gallium (Ga).

The substrate 100 may include first photoelectric conversion regions PD1 and second photoelectric conversion regions PD2. The first and second photoelectric conversion regions PD1 and PD2 may be interposed between the first and second surfaces 100a and 100b of the substrate 100. The substrate 100 may include the first photoelectric conversion regions PD1 provided on corresponding first pixel regions PX1. The substrate 100 may also include the second photoelectric conversion regions PD2 provided on corresponding second pixel regions PX2. The first and second photoelectric conversion regions PD1 and PD2 may further include a V-group element. The V-group element may be an impurity having a second conductivity type. The first and second photoelectric conversion regions PD1 and PD2 may each be a zone where the substrate 100 is doped with second conductivity type impurities. In some embodiments, the second conductivity type impurities may have a conductivity type opposite to that of the first conductivity type impurities. The second conductivity type impurities may include n-type impurities, such as one or more of phosphorus, arsenic, bismuth, and antimony. The first and second photoelectric conversion regions PD1 and PD2 may be disposed deep beneath the second surface 100b of the substrate 100.

Each of the first and second photoelectric conversion regions PD1 and PD2 may have a same function and a same role as the function and role of the photoelectric conversion region PD discussed in the example in FIG. 1. In contrast, volumes of the second photoelectric conversion regions PD2 may be less than volumes of the first photoelectric conversion regions PD1. For example, the widths of the second photoelectric conversion regions PD2 may be less than the widths of the first photoelectric conversion regions PD1. Charge storage capabilities of the second photoelectric conversion regions PD2 may be less than charge storage capabilities of the first photoelectric conversion regions PD1. The following will discuss a single first pixel region PX1 and a single second pixel region PX2 by way of example. However, it will be understood that the description applies equally to other first pixel regions PX1 and second pixel regions PX2 of the image sensor.

The substrate 100 may be provided therein with the isolation pattern 210 that defines the first and second pixel regions PX1 and PX2. For example, the isolation pattern 210 may be provided between the first and second pixel regions PX1 and PX2 of the substrate 100. The isolation pattern 210 may be a pixel isolation pattern. The isolation pattern 210 may be provided in a first trench 191, and the first trench 191 may be recessed from the second surface 100b of the substrate 100. In some embodiments, the isolation pattern 210 may be a deep trench isolation (DTI) layer. The isolation pattern 210 may further penetrate the first surface 100a of the substrate 100. The isolation pattern 210 may have, at a top surface of the isolation pattern 210, a width W21 less than a width W22 at a bottom surface of the isolation pattern 210. The top surface of the isolation pattern 210 may be coplanar with the first surface 100a of the substrate 100. The bottom surface of the isolation pattern 210 may stand opposite to the top surface of the isolation pattern 210.

The isolation pattern 210 may include a dielectric isolation pattern 211, a conductive isolation pattern 215, and a capping pattern 217. The dielectric isolation pattern 211 may be provided along a sidewall of the first trench 191. The dielectric isolation pattern 211 may include, for example, one or more of a silicon-based dielectric material (e.g., silicon nitride, silicon oxide, and silicon oxynitride) and a high-k dielectric material (e.g., hafnium oxide and aluminum oxide). Alternatively, the dielectric isolation pattern 211 may include a plurality of layers, which layers may include different materials from each other. The dielectric isolation pattern 211 may have a refractive index less than that of the substrate 100. Accordingly, a crosstalk issue may be prevented or reduced between the first and second pixel regions PX1 and PX2 of the substrate 100.

The conductive isolation pattern 215 may be provided in the dielectric isolation pattern 211. The dielectric isolation pattern 211 may be interposed between the conductive isolation pattern 215 and the substrate 100. When the image sensor operates, the conductive isolation pattern 215 may be supplied with a negative bias voltage to prevent the occurrence of dark current between the isolation pattern 210 and the substrate 100. The dielectric isolation pattern 211 may separate the conductive isolation pattern 215 from the substrate 100. Therefore, the conductive isolation pattern 215 may be electrically divided from the substrate 100. The conductive isolation pattern 215 may include a crystalline semiconductor material, such as polysilicon. The conductive isolation pattern 215 may further include dopants, which dopants may include first conductivity type impurities or second conductivity type impurities. For example, the conductive isolation pattern 215 may include doped polysilicon. The conductive isolation pattern 215 may have a bottom surface that is upwardly convex. However, the bottom surface of the conductive isolation pattern 215 is not limited to the shape mentioned above, but may be variously changed.

The capping pattern 217 may be disposed on the bottom surface of the conductive isolation pattern 215, and may cover a lower sidewall of the dielectric isolation pattern 211. The capping pattern 217 may fill a lower portion of the first trench 191. The dielectric isolation pattern 211 may further extend into a gap between the substrate 100 and the capping pattern 217. The capping pattern 217 may include a silicon-containing dielectric material, such as one or more of silicon oxide, tetraethyl orthosilicate (TEOS), and silicon oxynitride. Alternatively, the isolation pattern 210 may not include the capping pattern 217, and the bottom surface of the conductive isolation pattern 215 may be located at substantially the same level as that of the second surface 100b of the substrate 100.

The first gate pattern G1 and the second gate pattern G2 may be disposed on the second surface 100b of the substrate 100. The first gate pattern G1 may be provided on the first pixel region PX1. The second gate pattern G2 may be provided on the second pixel region PX2. Each of the first and second gate patterns G1 and G2 may serve as a gate electrode for one of the transfer transistor Tx, the source follower transistor Sx, the reset transistor Rx, and the selection transistor Ax that are discussed above in FIG. 1. For example, each of the first and second gate patterns G1 and G2 may include one of the transfer gate TG, the source follower gate SG, the reset gate RG, and the selection gate AG.

For simplicity of drawing, FIG. 2B depicts that a single first gate pattern G1 is disposed on the first pixel region PX1, but in some embodiments, a plurality of first gate patterns G1 may be disposed on the first pixel region PX1. In addition, a plurality of second gate patterns G2 may be disposed on the second pixel region PX2. The following will discuss a single first gate pattern G1 and a single second gate pattern G2 by way of example.

Each of the first and second gate patterns G1 and G2 may have a vertical gate structure or a buried gate structure. For example, each of the first and second gate patterns G1 and G2 may include a first part 310 and a second part 320. The first part 310 of each of the first and second gate patterns G1 and G2 may protrude into the substrate 100. The first part 310 may be a vertical segment and may have a major axis parallel to the third direction D5. The second part 320 may be disposed on the second surface 100b of the substrate 100. The second part 320 may be a horizontal segment. The second part 320 may be connected to the first part 310. The second part 320 may include the same material as that of the first part 310. The first and second gate patterns G1 and G2 may include metal, metal silicide, polysilicon, or any combination thereof. In this case, the polysilicon may include doped polysilicon.

A gate dielectric pattern 340 may be interposed between the substrate 100 and each of the first and second gate patterns G1 and G2. The gate dielectric pattern 340 may include, for example, one or more of a silicon-based dielectric material (e.g., silicon oxide, silicon nitride, and silicon oxynitride) and a high-k dielectric material (e.g., hafnium oxide and aluminum oxide).

The substrate 100 may include a first floating diffusion region FD1 and a second floating diffusion region FD2. The first floating diffusion region FD1 may be provided in the first pixel region PX1 and disposed on one side of the first gate pattern G1. The second floating diffusion region FD2 may be provided in the second pixel region PX2 and disposed on one side of the second gate pattern G2. The first and second floating diffusion regions FD1 and FD2 may be adjacent to the second surface 100b of the substrate 100. The first and second floating diffusion regions FD1 and FD2 may have bottom surfaces that are spaced apart from the first and second photoelectric conversion regions PX1 and PX2, respectively. The first and second floating diffusion regions FD1 and FD2 may each be a zone doped with second conductivity type impurities (e.g., n-type impurities). Each of the first and second floating diffusion regions FD1 and FD2 may have substantially a same function and a same role as the function and role of the floating diffusion region FD discussed in the example of FIG. 1. For example, when the image sensor operates, the first floating diffusion region FD1 may receive charges generated from the first photoelectric conversion region PD1. The second floating diffusion region FD2 may receive charges generated from the second photoelectric conversion region PD2.

The substrate 100 may include an impurity region 111. The impurity region 111 may be disposed in the substrate 100 on the first pixel region PX1. The impurity region 111 may be adjacent to the second surface 100b of the substrate 100. The impurity region 111 may have a bottom surface that is spaced apart from the first photoelectric conversion region PD1. Although not shown, in some embodiments, the impurity region 111 may further be disposed in the substrate 100 on the second pixel region PX2. The impurity region 111 may be a zone doped with second conductivity type impurities (e.g., n-type impurities). The impurity region 111 may be an active region. In this case, the active region may be a zone for operation of a transistor, and may include source/drain regions of the transistor discussed with reference to FIG. 1. The transistor may include one of the source follower transistor Sx, the reset transistor Rx, and the selection transistor Ax that are discussed with reference to FIG. 1.

The device isolation pattern 220 may be provided in the substrate 100. The device isolation pattern 220 may define active regions. For example, the device isolation pattern 220 may define the impurity region 111, the first floating diffusion region FD1, and the second floating diffusion region FD2. For example, the device isolation pattern 220 may be disposed in the substrate 100 on at least one side of one of the impurity region 111, on one side of the first floating diffusion region FD1, and/or on one side of the second floating diffusion region FD2. The device isolation pattern 220 may be provided in a second trench 192, and the second trench 192 may be recessed from the second surface 100b of the substrate 100. In some embodiments, the device isolation pattern 220 may be a shallow trench isolation (STI) layer. For example, the device isolation pattern 220 may have a height less than a height of the isolation pattern 210. A portion of the device isolation pattern 220 may be connected to a sidewall of the dielectric isolation pattern 211. The device isolation pattern 220 may include, for example, one or more of silicon oxide, silicon nitride, and silicon oxynitride.

The substrate 100 may include, on the first surface 100a, the color filters CF. The color filters CF may be correspondingly disposed on the plurality of unit pixel groups UPG. The color filters CF may constitute color filter arrays. Each of the color filters CF may have a planar shape that corresponds to that of a corresponding unit pixel group UPG. Each of the color filters CF may include one of red, blue, and green filters.

Each of the color filters CF may be disposed on corresponding first and second pixel regions PX1 and PX2 of a corresponding unit pixel group UPG. Each of the color filters CF may vertically overlap the first photoelectric conversion region PD1 and the second photoelectric conversion region PD2. Therefore, the color filter CF may be shared by the first photoelectric conversion region PD1 and the second photoelectric conversion region PD2 of a corresponding unit pixel group UPG. The first photoelectric conversion region PD1 and the second photoelectric conversion region PD2 of the corresponding unit pixel group UPG may output a photoelectric signal from light that passes through a single color filter CF. For a given unit pixel group UPG, a photoelectric conversion signal that is output from the second pixel region PX2 may be used to correct a photoelectric conversion signal that is output from the first pixel region PX1.

The image sensor may further include the fence pattern 450. The fence pattern 450 may be interposed between two neighboring color filters CF and separate the two neighboring color filters CF. For example, the fence pattern 450 may optically separate a plurality of color filters CF from each other. The fence pattern 450 may vertically overlap at least a portion of the isolation pattern 210. The fence pattern 450 may include metal, metal nitride, or a low-refractive material. For example, the fence pattern 450 may include titanium or titanium nitride. The low-refractive material may include a polymer and nano-particles in the polymer, and may have dielectric properties. The nano-particles may include, for example, silica.

The image sensor may further include the dielectric layer 400. The dielectric layer 400 may be interposed between the substrate 100 and the color filters CF and between the isolation pattern 210 and the fence pattern 450. The dielectric layer 400 may be a backside dielectric layer. The dielectric layer 400 may include a bottom antireflective coating (BARC) layer. In some embodiments, the dielectric layer 400 may include a plurality of layers. For example, the dielectric layer 400 may include a fixed charge layer, a buried dielectric layer, a silicon nitride layer, and a capping layer that are stacked on the first surface 100a of the substrate 100. The fixed charge layer may include metal oxide, such as stacked aluminum and hafnium oxides. The buried dielectric layer may include tetraethyl orthosilicate (TEOS) or silicon oxide. The capping layer may include metal oxide, such as hafnium oxide. The dielectric layer 400 may exclude one or more of the fixed charge layer, the buried dielectric layer, the silicon nitride layer, and the capping layer.

The image sensor may further include the protective layer 430. The protective layer 430 may be interposed between the dielectric layer 400 and the color filters CF and between the fence pattern 450 and the color filters CF. For example, the protective layer 430 may include aluminum oxide or hafnium oxide. The protective layer 430 may protect the first and second photoelectric conversion regions PD1 and PD2 from external environment.

The microlens layer 500 may be disposed on the first surface 100a of the substrate 100, and may cover the plurality of unit pixel groups UPG. For example, the microlens layer 500 may be disposed on the color filters CF. The microlens layer 500 may include a planarized layer 530, a first lens pattern 510, and a second lens pattern 520. The planarized layer 530 of the microlens layer 500 may be disposed on the color filters CF.

The first lens pattern 510 may be disposed on the planarized layer 530 of the microlens layer 500. The first lens pattern 510 may be provided on the first pixel region PX1, and may be disposed on a position that corresponds to a position of the first photoelectric conversion region PD1. Accordingly, in the image sensor, a plurality of the first lens patterns 510 may be provided corresponding respectively to the first pixel regions PX1. The first lens pattern 510 may have a first surface 510a and a bottom surface. The bottom surface of the first lens pattern 510 may be an imaginary surface, which imaginary surface may be directed toward the substrate 100. The first surface 510a may be a top surface of the first lens pattern 510, which first surface 510a may not be directed toward the substrate 100. The first surface 510a of the first lens pattern 510 may protrude away from the first surface 100a of the substrate 100. The first surface 510a of the first lens pattern 510 may be a curved surface. For example, in some embodiments, the first lens pattern 510 may have a hemispheric cross-section. The first lens pattern 510 may focus light on the first photoelectric conversion region PD1. A curvature of the first surface 510a may adjust a focus of the first lens pattern 510. Therefore, it may be possible to adjust an amount of light incident on the first photoelectric conversion region PD1. According to some example embodiments, the first surface 510a of the first lens pattern 510 and the first surface 100a of the substrate 100 may have therebetween a maximum interval A that is about 2.5 to about 3.5 times a first radius. In this description, the first radius may be a radius of an imaginary hemisphere (or an imaginary circle) that is hypothetically formed by at least three points selected from points on the first surface 510a of the first lens pattern 510. The maximum interval A may correspond to a spacing distance between an uppermost portion on the first surface 510a of the first lens pattern 510 and the first surface 100a of the substrate 100. When the maximum interval A between the first surface 510a of the first lens pattern 510 and the first surface 100a of the substrate 100 is less than about 2.5 times the first radius, the first photoelectric conversion region PD1 may receive a reduced amount of incident light. When the maximum interval A between the first surface 510a of the first lens pattern 510 and the first surface 100a of the substrate 100 is greater than about 3.5 times the first radius, a focus of incident light may be directed toward the device isolation pattern 220 or the first gate pattern G1. In this case, light may be scattered by the device isolation pattern 220 or the first gate pattern G1. According to some example embodiments, because the maximum interval A between the first surface 510a of the first lens pattern 510 and the first surface 100a of the substrate 100 is in a range of about 2.5 times to about 3.5 times the first radius, the image sensor may increase in optical properties.

The first lens pattern 510 may have a first lens width W1 and a first height H1. The first lens width W1 may be a width at the bottom surface of the first lens pattern 510. The bottom surface of the first lens pattern 510 may be an imaginary surface, which may be located at a same level as a level of a location where the first surface 510a of the first lens pattern 510 meets a second surface 520a of the second lens pattern 520. The first height H1 may be a spacing distance between the uppermost portion of the first surface 510a and the bottom surface of the first lens pattern 510. For example, the first height H1 may be a maximum height of the first lens pattern 510. The first height H1 may correspond to a difference between a maximum level and a minimum level of the first surface 510a of the first lens pattern 510. The first height H1 may be about 30% to about 50% of the first lens width W1. When the first height H1 is less than about 30% of the first lens width W1 or greater than about 50% of the first lens width W1, the first photoelectric conversion region PD1 may receive a reduced amount of incident light. Since the first height H1 is about 30% to about 50% of the first lens width W1, the maximum interval A between the first surface 510a of the first lens pattern 510 and the first surface 100a of the substrate 100 may fall within in a range of about 2.5 times to about 3.5 times the first radius.

The second lens pattern 520 of the microlens layer 500 may be disposed on the planarized layer 530 and placed laterally to the first lens pattern 510. The second lens pattern 520 may be provided on the second pixel region PX2, and may be disposed on a position that corresponds to a position of the second photoelectric conversion region PD2. Accordingly, in the image sensor, a plurality of the second lens patterns 520 may be provided corresponding respectively to the second pixel regions PX2. The second lens pattern 520 may have a second surface 520a and a bottom surface. The second surface 520a of the second lens pattern 520 may not be directed toward the substrate 100. The second surface 520a of the second lens pattern 520 may protrude away from the first surface 100a of the substrate 100. The second surface 520a of the second lens pattern 520 may be a curved surface. For example, in some embodiments, the first second pattern 520 may have a hemispheric cross-section. The second lens pattern 520 may focus light on the second photoelectric conversion region PD2. A curvature of the second surface 520a of the second lens pattern 520 may adjust an amount of light incident on the second photoelectric conversion region PD2. In some embodiments, the curvature of the second surface 520a of the second lens pattern 520 may be different from the curvature of the first surface 510a of the first lens pattern 510, but example embodiments are not limited thereto.

The second lens pattern 520 may have a second lens width W2 and a second height H2. The second lens width W2 may be a width at the bottom surface of the second lens pattern 520. The bottom surface of the second lens pattern 520 may be an imaginary surface and may be located at a same level as a level of a location where the first surface 510a of the first lens pattern 510 meets the second surface 520a of the second lens pattern 520. The bottom surface of the second lens pattern 520 may be directed toward the substrate 100. The second lens width W2 may be less than the first lens width W1. For example, the second lens width W2 may be about 30% to about 50% of the first lens width W1. The second height H2 may be a maximum height of the second lens pattern 520. The second height H2 may be a spacing distance between an uppermost portion of the second surface 520a of the second lens pattern 520 and the bottom surface of the second lens pattern 520. The second height H2 may correspond to a difference between a maximum level and a minimum level of the second surface 520a of the second lens pattern 520. The second height H2 may be less than the first height H1. For example, the second height H2 may be about 20% to about 30% of the first height H1. According to some example embodiments, because the second height H2 is about 20% to about 30% of the first height H1, and because the second lens width W2 is about 30% to about 50% of the first lens width W1, the second photoelectric conversion region PD2 may receive an increased amount of incident light, and the image sensor may have high integration of the first and second pixel regions PX1 and PX2.

As shown in FIG. 2A, when viewed in the first direction D1, a plurality of second lens patterns 520 may be correspondingly disposed between the first lens patterns 510. For example, the first lens patterns 510 and the second lens patterns 520 may be disposed alternately with each other in the first direction D1. When viewed in the second direction D2, the second lens patterns 520 may be correspondingly disposed between the first lens patterns 510. The first lens patterns 510 may be arranged along the first and second diagonal directions D3 and D4. When viewed in plan view, each of the plurality of second lens patterns 520 may be surrounded by four neighboring first lens patterns 510. Since the second lens width W2 is less than the first lens width W1, the second lens patterns 520 may be disposed on zones (or non-occupied zones) of the image sensor that are not occupied by the first lens patterns 510. Therefore, the first and second pixel regions PX1 and PX2 may be disposed at high integration density. The non-occupied zones that are not occupied by the first lens patterns 510 may include the second pixel regions PX2.

The planarized layer 530 of the microlens layer 500 may be interposed between the substrate 100 and the first lens pattern 510 and between the substrate 100 and the second lens pattern 520. The planarized layer 530 may have a third height H3. The third height H3 may be a spacing distance between a top surface and a bottom surface of the planarized layer 530, which top surface of the planarized layer 530 may be an imaginary surface and may be located at a same level as a level of locations where the first lens patterns 510 meet the second lens patterns 520. The third height H3 may be about 0.8 times to about 1.5 times the first height H1. Since the third height H3 is equal to or greater than about 0.8 times the first height H1, the focus of the first lens pattern 510 may not be provided on the planarized layer 530, the color filter CF, or the dielectric layer 400. Since the third height H3 is equal to or less than about 1.5 times the first height H1, the device isolation pattern 220 may be prevented from scattering light that passes through the first lens pattern 510. The first and second lens patterns 510 and 520 may be integrally formed with the planarized layer 530 and connected to each other with no boundary therebetween.

The microlens layer 500 may be transparent to allow light to pass therethrough. The microlens layer 500 may include an organic material, such as a polymer. For example, the microlens layer 500 may include a photoresist material or a thermosetting resin.

The image sensor may further include a coating layer (not shown). The coating layer (not shown) may conformally cover the first surface 510a of the first lens pattern 510 and the second surface 520a of the second lens pattern 520. The coating layer may include an organic material and may be transparent.

The wiring layer 800 may be disposed on the second surface 100b of the substrate 100. The wiring layer 800 may include a first dielectric layer 810, a plurality of second dielectric layers 820, and a conductive structure 830. The first dielectric layer 810 may cover the second surface 100b of the substrate 100, a sidewall of the first gate pattern G1, and a sidewall of the second gate pattern G2. The plurality of second dielectric layers 820 may be stacked on the first dielectric layer 810. The first and second dielectric layers 810 and 820 may include a silicon-based dielectric material, such as one or more of silicon oxide, silicon nitride, and silicon oxynitride.

The conductive structure 830 may be provided in the first and second dielectric layers 810 and 820. The conductive structure 830 may include a contact plug part, a line part, and a via part. The contact plug part of the conductive structure 830 may be provided in the first dielectric layer 810 and electrically connected to one of the first floating diffusion region FD1, the second floating diffusion region FD2, the first gate pattern G1, and the second gate pattern G2. The line part of the conductive structure 830 may be interposed between two neighboring ones of the first and second dielectric layers 810 and 820. The line part may be connected to the contact plug part. The via part of the conductive structure 830 may penetrate at least one of the second dielectric layers 820 and may be connected to the line part.

The wiring layer 800 may further include a capacitor 840. The capacitor 840 may include a first electrode pattern 831, a second electrode pattern 832, and a dielectric layer 820D. The first electrode pattern 831 may be provided in the second dielectric layers 820. The first electrode pattern 831 may be electrically connected through the conductive structure 830 to the second floating diffusion region FD2. The second electrode pattern 832 may be provided in the second dielectric layers 820 and spaced apart from the first electrode pattern 831. The first and second electrode patterns 831 and 832 may include metal or conductive polymer. For example, the first electrode pattern 831 may be one of line parts of a plurality of conductive structures 830. The second electrode pattern 832 may be another of the line parts of the plurality of conductive structures 830. The dielectric layer 820D may be interposed between the first electrode pattern 831 and the second electrode pattern 832. In some embodiments, the dielectric layer 820D may be a portion of one of the second dielectric layers 820. For example, one of the second dielectric layers 820 may be interposed between the first electrode pattern 831 and the second electrode pattern 832, thereby forming the dielectric layer 820D. In this case, the dielectric layer 820D and the one of the second dielectric layers 820 may be connected to each other with no boundary therebetween. The capacitor 840 may not be connected to the first floating diffusion region FD1, but embodiments are not limited thereto.

According to some example embodiments, a time required for storing charges in the second photoelectric conversion region PD2 may be different from that required for storing charges in the first photoelectric conversion region PD1. During a first period in which stored charges is transferred from the first photoelectric conversion region PD1 to the first floating diffusion region FD1, the first pixel region PX1 may have difficulty in obtaining information of incident light. During the first period, the second photoelectric conversion region PD2 may store charges in response to incident light. A single color filter CF may be shared by the first photoelectric conversion region PD1 and the second photoelectric conversion region PD2 of a unit pixel group UPG. A photoelectric conversion signal that is output from the second pixel region PX2 may be used to correct a photoelectric conversion signal that is output from the first pixel region PX1. Therefore, it may be possible to prevent loss of information about light during the first period.

According to some example embodiments, the second photoelectric conversion region PD2 may have a storage capacity less than a storage capacity of the first photoelectric conversion region PD1. Since the capacitor 840 is connected to the second floating diffusion region FD2 of the second pixel region PX2, it may be possible to compensate the storage capacity of the second photoelectric conversion region PD2. Accordingly, the image sensor may increase in optical properties.

Differently from that shown in FIGS. 2A and 2B, in some embodiments the substrate 100 may omit the second pixel region PX2, and the microlens layer 500 may omit the second lens pattern 520. Additional components, such as the second gate pattern G2 and the second floating diffusion region FD2 on the second pixel region PX2, may also be omitted. In this case, the first pixel region PX1 may have a tetragonal shape when viewed in plan view. Nevertheless, the description set forth above may be applicable to the first height H1 and the first lens width W1 of the first lens pattern 510, and also to the maximum interval A between the first surface 510a of the first lens pattern 510 and the first surface 100a of the substrate 100.

FIGS. 3A to 3G illustrate cross-sectional views showing a method of fabricating an image sensor according to some example embodiments. A duplicate description will be omitted below for conciseness.

Figure 3A:
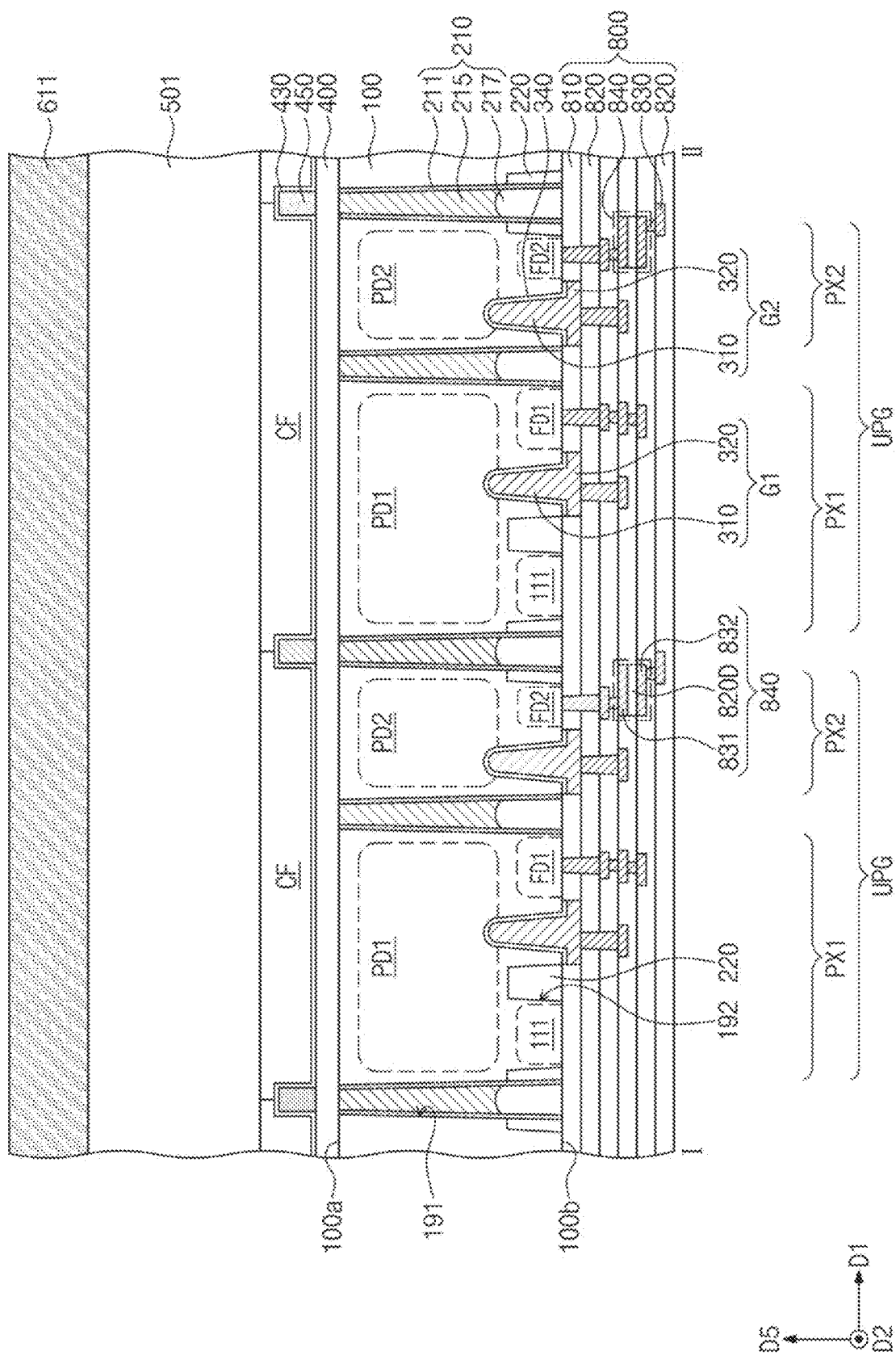
FIGS. 3A to 3G illustrate cross-sectional views showing a method of fabricating an image sensor according to some example embodiments.

Referring to FIG. 3A, a substrate 100 may be prepared which has first and second pixel regions PX1 and PX2. The substrate 100 may be doped with first conductivity type impurities. The substrate 100 may be doped with second conductivity type impurities to form first and second photoelectric conversion regions PD1 and PD2. A second trench 192 and a device isolation pattern 220 may be formed on a second surface 100b of the substrate 100. A first trench 191 and an isolation pattern 210 may be formed in the substrate 100. A second surface 100b of the substrate 100 may be doped with first conductivity type impurities to form first and second floating diffusion regions FD1 and FD2 and an impurity region 111. A first gate pattern G1 and a second gate pattern G2 may be respectively formed on the first pixel region PX1 and the second pixel region PX2. A wiring layer 800 may be manufactured by forming first and second dielectric layers 810 and 820 and conductive structures 830 on the second surface 100b of the substrate 100. In this case, a capacitor 840 may further be formed.

A first surface 100a of the substrate 100 may undergo a grinding process to thin the substrate 100. A dielectric layer 400, a fence pattern 450, a protective layer 430, and a plurality of color filters CF may be formed on the first surface 100a of the thinned substrate 100.

A preliminary lens layer 501 may be formed on the first surface 100a of the substrate 100, thereby covering top surfaces of the color filters CF. The preliminary lens layer 501 may be formed by a coating process that uses a photoresist material or a thermosetting resin. The preliminary lens layer 501 may have a top surface that is substantially flat. For example, the top surface of the preliminary lens layer 501 may be parallel to a first direction D1. In some embodiments, the top surface of the preliminary lens layer 501 may be parallel to the first surface 100a of the substrate 100.

A first sacrificial layer 611 may be formed on the preliminary lens layer 501. The first sacrificial layer 611 may be formed by, for example, a coating process. The first sacrificial layer 611 may include an organic material. For example, the first sacrificial layer 611 may include a polymer, such as photoresist. The first sacrificial layer 611 may be, for example, a resist layer.

Figure 3B:
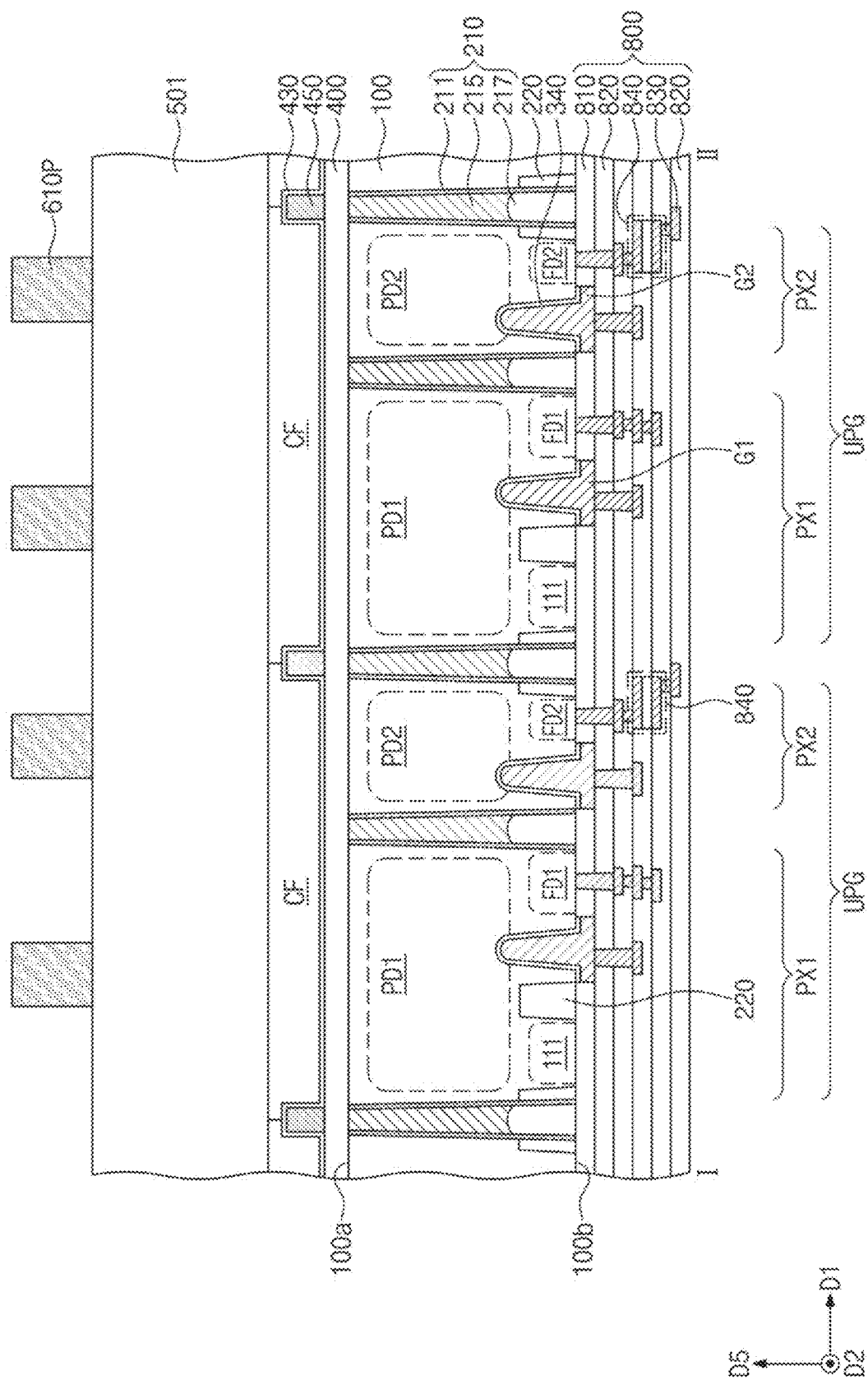

Referring to FIG. 3B, the first sacrificial layer 611 may be patterned to form a first preliminary sacrificial pattern 610P. The patterning of the first sacrificial layer 611 may be performed by exposure and development processes. For example, the first sacrificial layer 611 may be exposed by an exposure process and, after the exposure process, the first sacrificial layer 611 may include an exposed portion and a non-exposed portion. The exposed portion of the first sacrificial layer 611 may include a material whose chemical structure is different from that of the non-exposed portion of the first sacrificial layer 611. During the development process, one or more of the exposed and non-exposed portion of the first sacrificial layer 611 may be removed to form the first preliminary sacrificial pattern 610P. The first preliminary sacrificial pattern 610P may be provided in plural, and the plurality of first preliminary sacrificial patterns 610P may be correspondingly formed on the first and second pixel regions PX1 and PX2. That is, a first preliminary sacrificial pattern 610P of the plurality of the first preliminary sacrificial patterns 610P may be formed on each of the first pixel regions PX1 and on each of the second pixel regions PX2. The first preliminary sacrificial patterns 610P may be laterally spaced apart from each other. In some embodiments, each of the first preliminary sacrificial patterns 610P may have a height that is substantially the same height. Top surfaces of the first preliminary sacrificial patterns 610P may be parallel to the first direction D1, but embodiments are not limited thereto.

Figure 3C:
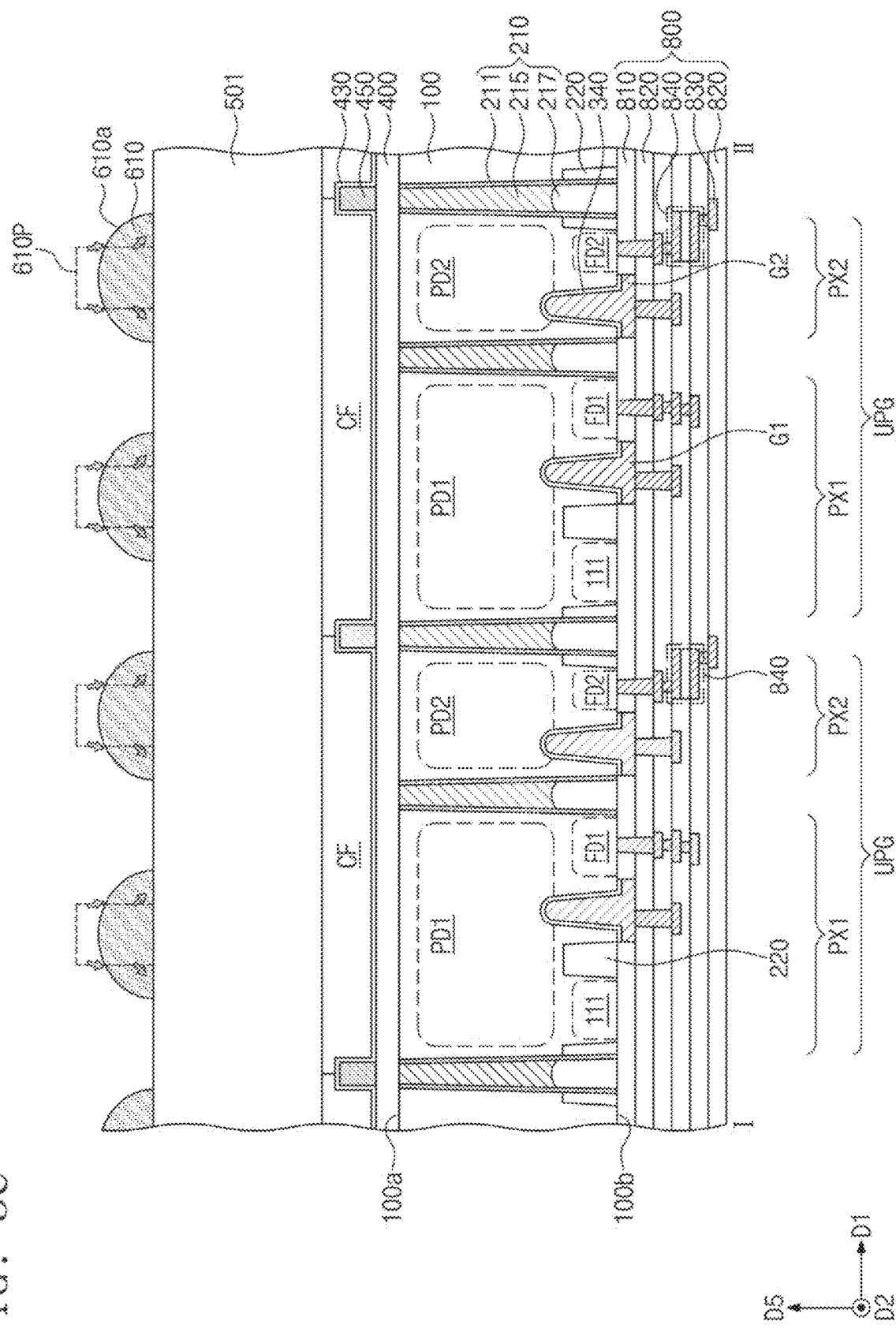

Referring to FIG. 3C, the first preliminary sacrificial patterns 610P may be reflowed to correspondingly form first sacrificial patterns 610. The first preliminary sacrificial patterns 610P may be reflowed at a temperature between about 130° C. and about 200° C. During the reflow process, as indicated by the arrows in FIG. 3C, the first preliminary sacrificial patterns 610P may downwardly flow toward a top surface of the preliminary lens layer 501. Top surfaces and sidewalls of the first preliminary sacrificial patterns 610P may form first surfaces 610a of corresponding ones of the first sacrificial patterns 610. The first surfaces 610a of the first sacrificial patterns 610 may each be a curved surface. The first surfaces 610a of the first sacrificial patterns 610 may each have an upwardly convex shape. The first surfaces 610a of the first sacrificial patterns 610 may project from the preliminary lens layer 501 without being directed toward the preliminary lens layer 501. For example, in some embodiments, each of the first sacrificial patterns 610 may have a hemispheric shape.

The first sacrificial patterns 610 may be provided on corresponding positions that correspond to the positions of the first and second pixel regions PX1 and PX2. The first sacrificial patterns 610 may be laterally spaced apart from each other. Heights of the first sacrificial patterns 610 may be identical or similar to each other. Widths of the first sacrificial patterns 610 may be identical or similar to each other.

Figure 3D:
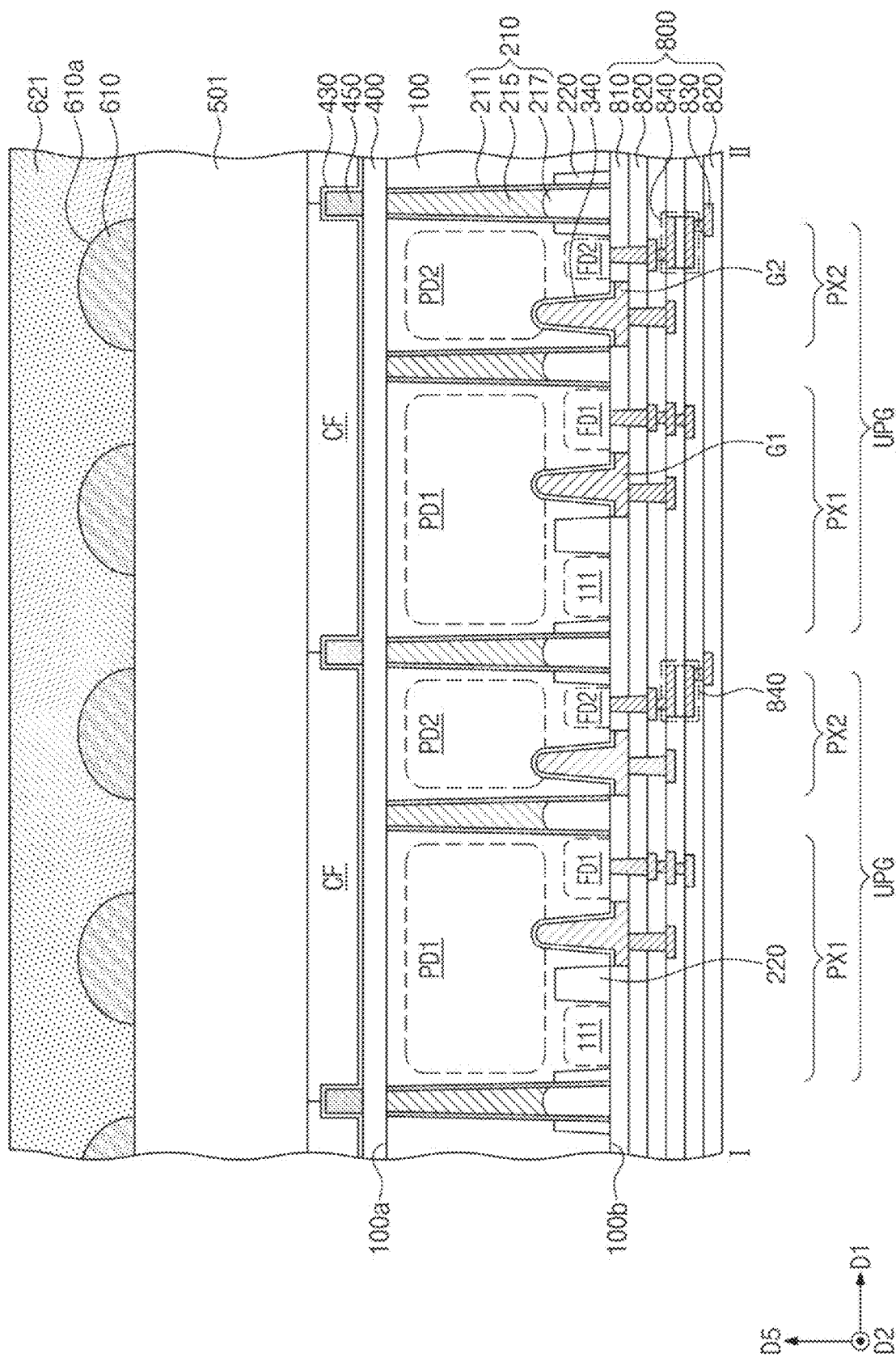

Referring to FIG. 3D, a second sacrificial layer 621 may be formed on the preliminary lens layer 501, thereby covering the first sacrificial patterns 610. The formation of the second sacrificial layer 621 may include coating an organic material on the preliminary lens layer 501 and the first sacrificial patterns 610. The second sacrificial layer 621 may include a polymer, such as photoresist. The second sacrificial layer 621 may be, for example, a resist layer. In some embodiments, the second sacrificial layer 621 may include a same material as a material of the first sacrificial patterns 610. Alternatively, in other embodiments, the second sacrificial layer 621 may include a different material from the material of the first sacrificial patterns 610.

Figure 3E:
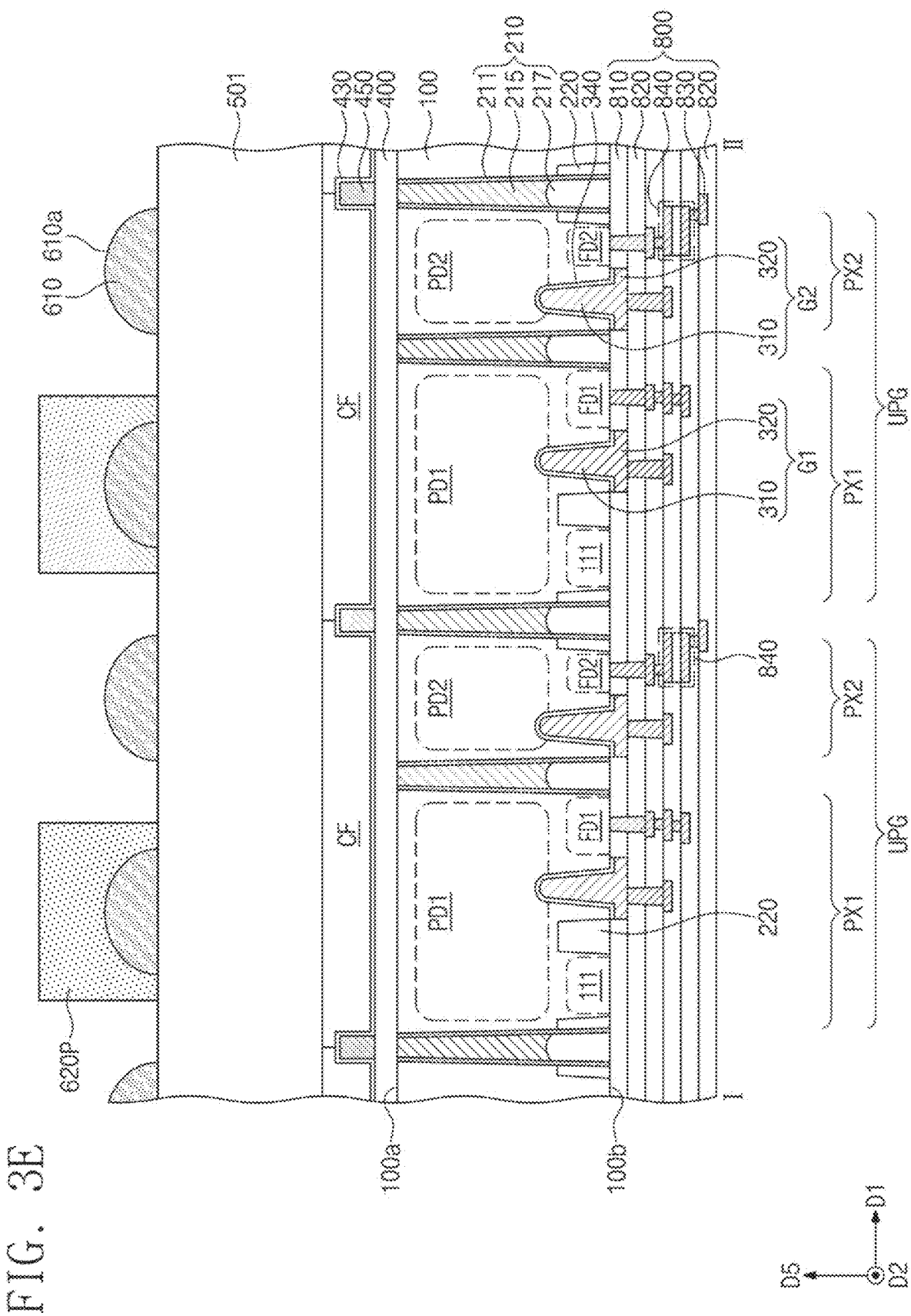

Referring to FIG. 3E, the second sacrificial layer 621 may be patterned to form second preliminary sacrificial patterns 620P. The patterning of the second sacrificial layer 621 may be performed by exposure and development processes similar to the exposure and development process of the patterning of the first sacrificial layer 611 described above and a repeated description is omitted for conciseness. The second preliminary sacrificial patterns 620P may be laterally spaced apart from each other. The second preliminary sacrificial patterns 620P may be formed on corresponding first pixel regions PX1 of the substrate 100, thereby covering corresponding first preliminary sacrificial patterns 610P. For example, each of the second preliminary sacrificial patterns 620P may cover a corresponding respective one of the first sacrificial patterns 610. The second preliminary sacrificial patterns 620P may not be formed on the second pixel regions PX2. The second preliminary sacrificial patterns 620P may expose the first sacrificial patterns 610 on the first pixel regions PX1.

Figure 3F:
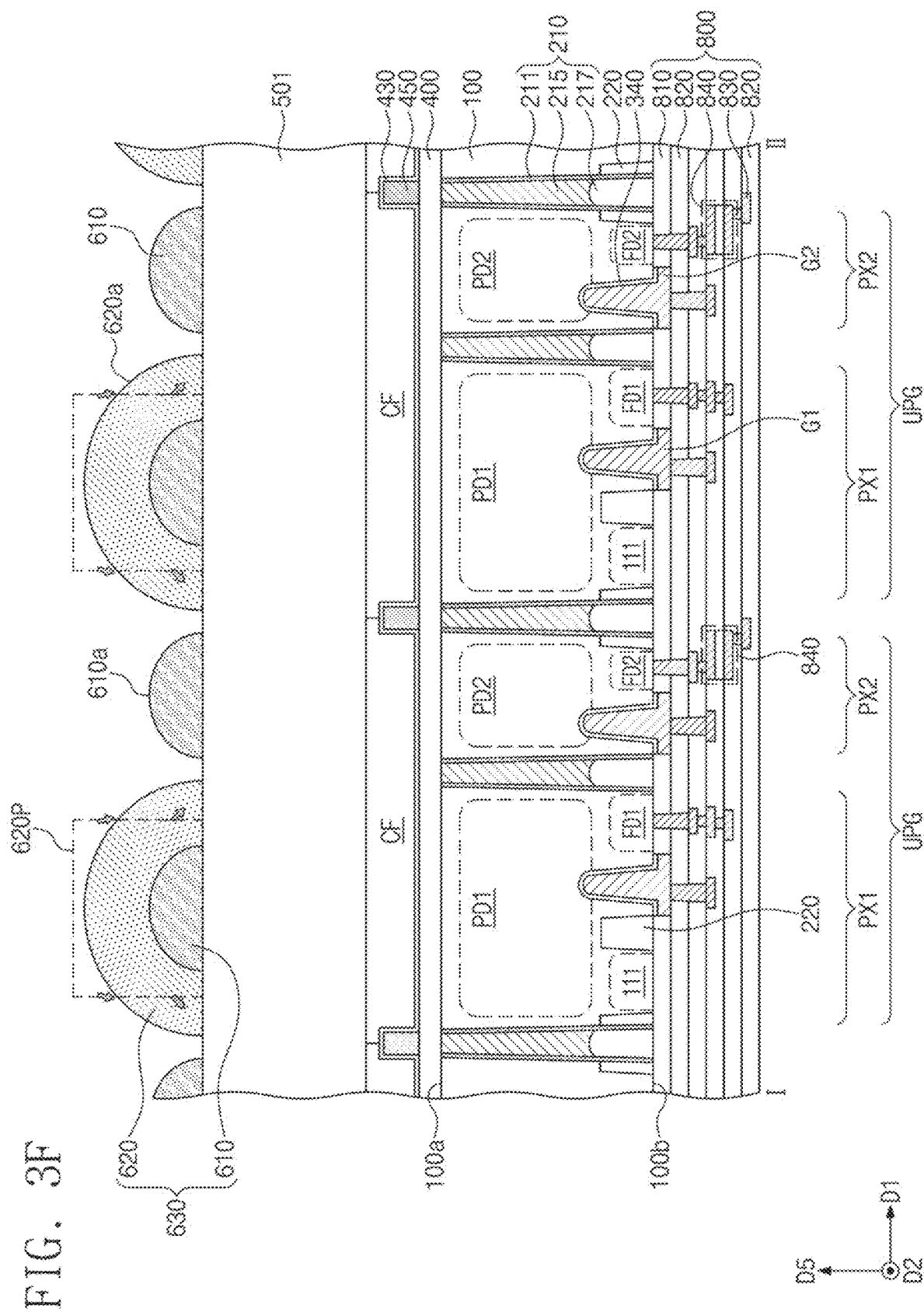

Referring to FIG. 3F, the second preliminary sacrificial patterns 620P may be reflowed to correspondingly form second sacrificial patterns 620. Therefore, sacrificial structures 630 may be formed on corresponding first pixel regions PX1 of the substrate 100. Each of the sacrificial structures 630 may include the second sacrificial pattern 620 and a corresponding respective one of the first sacrificial patterns 610. The sacrificial structures 630 may not be formed on the second pixel regions PX2.

The second preliminary sacrificial patterns 620P may be reflowed at a temperature between about 130° C. and about 200° C. During the reflow process, as indicated by arrows in FIG. 3F, the second preliminary sacrificial patterns 620P may downwardly flow toward the top surface of the preliminary lens layer 501. Top surfaces and sidewalls of the second preliminary sacrificial patterns 620P may form second surfaces 620a of corresponding ones of the second sacrificial patterns 620. The second surfaces 620a of the second sacrificial patterns 620 may be externally exposed. The second surfaces 620a of the second sacrificial patterns 620 may form curved surfaces. For example, each of the second surfaces 620a of the second sacrificial patterns 620 may have an upwardly convex shape. In this case, in some embodiments, each of the sacrificial structures 630 may have a hemispheric shape.

The second sacrificial patterns 620 may be laterally spaced apart from each other. The second sacrificial patterns 620 may be provided on corresponding positions that correspond to positions of the first pixel regions PX1. The second sacrificial patterns 620 may not be provided on the second pixel regions PX2. According to some example embodiments, since the second preliminary sacrificial patterns 620P are formed on the first sacrificial patterns 610, the second preliminary sacrificial patterns 620P may have respective second surfaces each of whose uppermost portions is located at a relatively high level. Therefore, the second surfaces 620a of the second sacrificial patterns 620 may have uppermost portions at a higher level than a level of uppermost portions of the first surfaces 610a of the first sacrificial patterns 610 on the first pixel regions PX1. In some embodiments, the second surfaces 620a of the second sacrificial patterns 620 may have curvatures different from curvatures of the first surfaces 610a of the first sacrificial patterns 610. Each of the second sacrificial patterns 620 may have a height that is substantially the same height. Each of the second sacrificial patterns 620 may have a width that is substantially the same width.

Figure 3G:
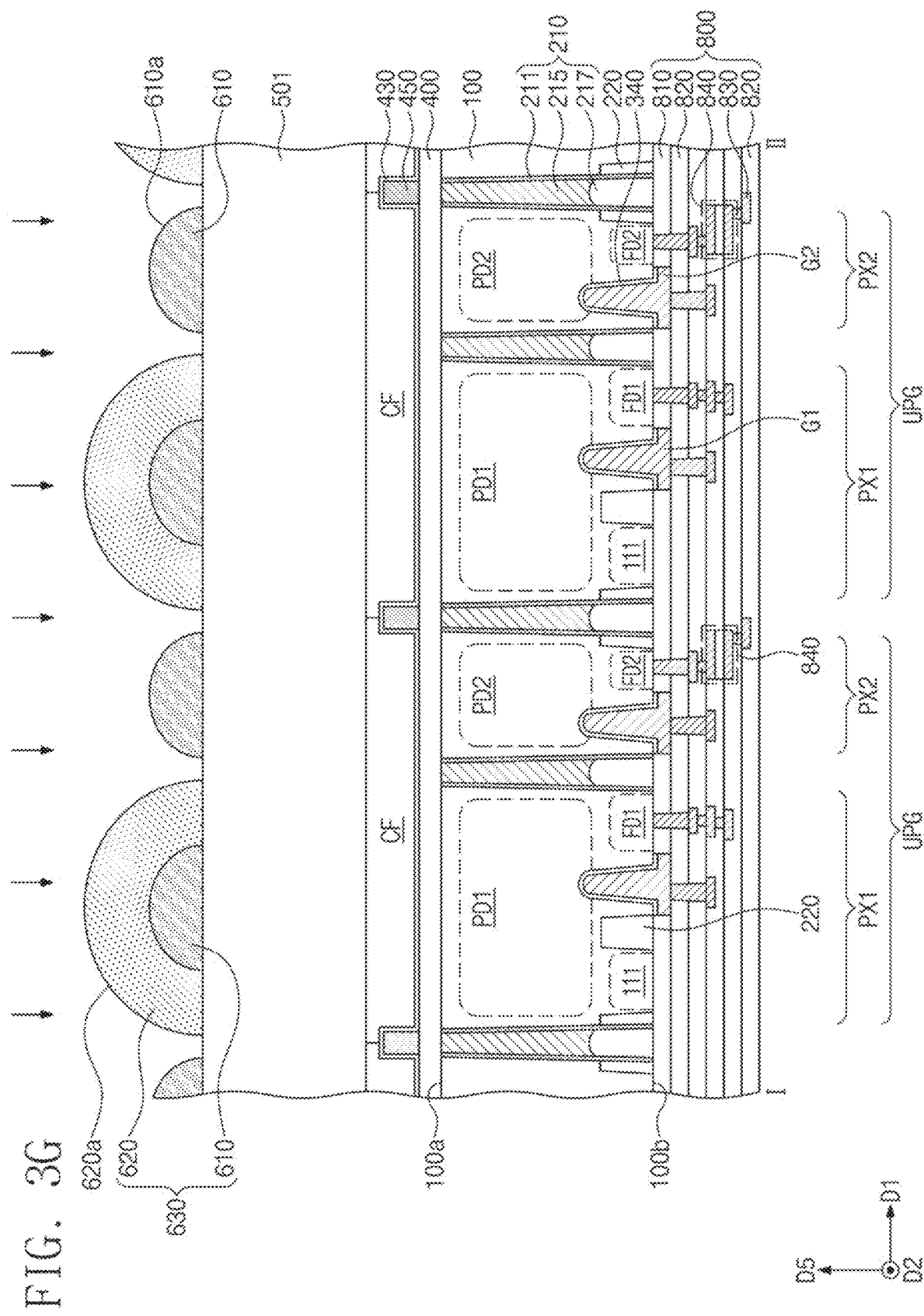

Referring sequentially to FIGS. 3G and 2B, the first and second sacrificial patterns 610 and 620 may undergo an etch-back process to form a microlens layer 500. The etch-back process may be performed such that shapes of the first sacrificial patterns 610 may be transferred onto the preliminary lens layer 501, and thus that second lens patterns 520 may be formed. Shapes of the sacrificial structures 630 may be transferred onto the preliminary lens layer 501, and thus first lens patterns 510 may be formed.

When a single resist pattern is reflowed to form a sacrificial pattern, the sacrificial pattern may have difficulty in having a height greater than a specific value. The sacrificial pattern may be used to form a lens pattern, which lens pattern may have a curvature limited by that of the sacrificial pattern.

By contrast, the sacrificial structures 630 may each include the first sacrificial pattern 610 and the second sacrificial pattern 620, and thus may have relatively large heights. As discussed with respect to FIG. 3F, on the first sacrificial patterns 610, the second preliminary sacrificial patterns 620P may be reflowed to form the second sacrificial patterns 620. Therefore, the second surfaces 620a of the second sacrificial patterns 620 may have curvatures different from curvatures of the sacrificial pattern formed by reflow of the single resist as in the related art. The curvatures of the second surfaces 620a of the second sacrificial patterns 620 may determine curvatures of the first surfaces 510a of the first lens patterns 510. The etch-back process may continue until termination of removal of the first sacrificial patterns 610 and the sacrificial structures 630. As a result of the etch-back process, there may be manufactured the microlens layer 500 including a planarized layer 530, a first lens pattern 510, and a second lens pattern 520. As shown in FIG. 2B, the first height H1 of the first lens pattern 510 may be about 30% to about 50% of the first width W1 of the first lens pattern 510. In addition, the maximum interval A between the first surface 510a of the first lens pattern 510 and the first surface 100a of the substrate 100 may be about 2.5 times to about 3.5 times the first radius. The examples mentioned above may fabricate the image sensor discussed in FIGS. 2A and 2B.

Differently from that shown, in some embodiments, the substrate 100 may include no second pixel region PX2, and no component may be formed on the second pixel region PX2. The second sacrificial patterns 620 discussed in FIG. 3F may be formed on corresponding first sacrificial patterns 610. The etch-back process of FIG. 3G may be performed on the sacrificial structures 630. Therefore, in this configuration, the description set forth above may be applicable to the first height H1 and the first lens width W1 of the first lens pattern 510, and also to the maximum interval A between the first surface 510a of the first lens pattern 510 and the first surface 100a of the substrate 100.

Figure 4A:
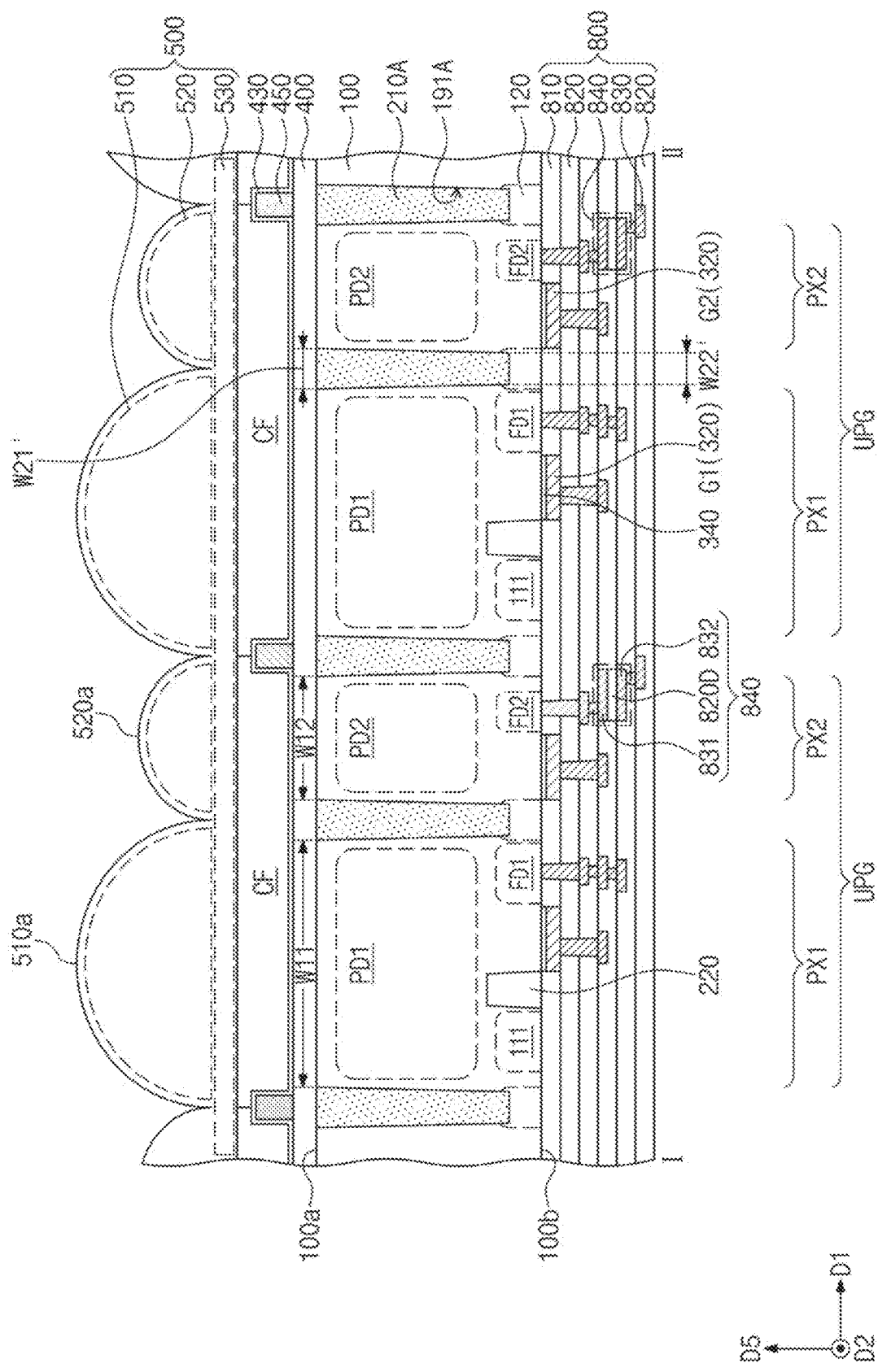
FIG. 4A illustrates a cross-sectional view showing an image sensor according to some example embodiments.

FIG. 4A illustrates a cross-sectional view taken along line I-II of FIG. 2A, showing an image sensor according to some example embodiments.

Referring to FIG. 4A, an image sensor may include a substrate 100, an isolation pattern 210A, a first gate pattern G1, a second gate pattern G2, a wiring layer 800, a dielectric layer 400, a protective layer 430, a fence pattern 450, color filters CF, and a microlens layer 500.

The substrate 100 may be provided therein with the isolation pattern 210 that defines first and second pixel regions PX1 and PX2. The isolation pattern 210A may be identical or similar to the isolation pattern 210 discussed with respect to FIGS. 2A and 2B. For example, the isolation pattern 210A may define the first and second pixel regions PX1 and PX2. In contrast with the isolation pattern 210 discussed with respect to FIGS. 2A and 2B, the isolation pattern 210A may be provided in a backside trench 191A, and the backside trench 191A may penetrate a first surface 100a of the substrate 100. The backside trench 191A may have a bottom surface provided in the substrate 100. The isolation pattern 210A may have a bottom surface that is spaced apart from a second surface 100b of the substrate 100 and is located at a higher level than a level of the second surface 100b. Alternatively, in some embodiments, the isolation pattern 210A may further penetrate the second surface 100b of the substrate 100. The isolation pattern 210A may have at a top surface a width W21' greater than a width W22' at a bottom surface of the isolation pattern 210A. The top surface of the isolation pattern 210A may be located at a level that is substantially the same level as a level of the first surface 100a of the substrate 100. The isolation pattern 210A may include neither a conductive isolation pattern 215 nor a capping pattern 217 that are discussed with respect to FIG. 2B, and may include a material that is the same material as a material of the dielectric isolation pattern 211 discussed with respect to FIG. 2B. For example, the isolation pattern 210A may include a silicon-based dielectric material that fills the backside trench 191A.

Differently from that shown in FIG. 4A, the isolation pattern 210A may further extend onto the first surface 100a of the substrate 100, and may further be provided between the substrate 100 and the dielectric layer 400.

For another example, in some embodiments, the isolation pattern 210A may include a material that is the same material as a material of the dielectric layer 400, and may be connected to the dielectric layer 400 with no boundary therebetween. In other words, the isolation pattern 210A and the dielectric layer 400 may be integrally formed with each other.

A pixel isolation region 120 may further be provided in the substrate 100. The pixel isolation region 120 may be provided between the bottom surface of the isolation pattern 210A and the second surface 100b of the substrate 100. The pixel isolation region 120 may include a III-group element. For example, the pixel isolation region 120 may be a zone doped with impurities having a first conductivity type (e.g., p-type). The pixel isolation region 120 and the isolation pattern 210A may define the first and second pixel regions PX1 and PX2. Alternatively, in some embodiments, the substrate 100 may omit the pixel isolation region 120.

The first and second gate patterns G1 and G2 may have a planar gate structure. Each of the first and second gate patterns G1 and G2 may include a second part 320, but may omit the first part 310 discussed with respect to FIG. 2B. The first and second gate patterns G1 and G2 may be located at a level that is the same as or lower than the second surface 100b of the substrate 100. A gate dielectric pattern 340 may be interposed between the substrate 100 and each of the first and second gate patterns G1 and G2. The gate dielectric pattern 340 may not extend into the substrate 100.

Figure 4B:
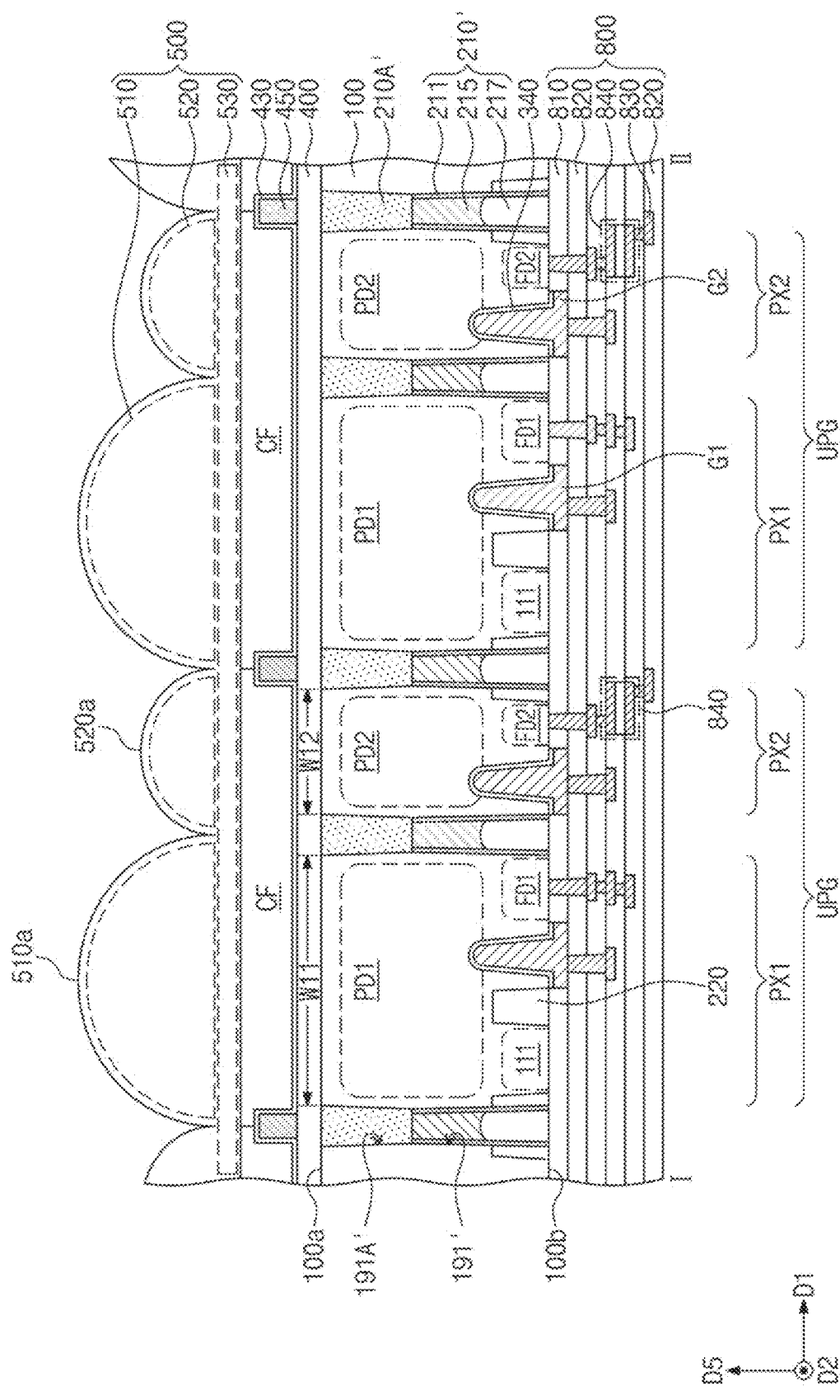
FIG. 4B illustrates a cross-sectional view showing an image sensor according to some example embodiments.

FIG. 4B illustrates a cross-sectional view taken along line I-II of FIG. 2A, showing an image sensor according to some example embodiments.

Referring to FIG. 4B, an image sensor may include a substrate 100, a first isolation pattern 210', a second isolation pattern 210A', a device isolation pattern 220, a first gate pattern G1, a second gate pattern G2, a wiring layer 800, a dielectric layer 400, a protective layer 430, a fence pattern 450, color filters CF, and a microlens layer 500.

The first isolation pattern 210' may be provided in the substrate 100 and between first and second photoelectric conversion regions PD1 and PD2. The first isolation pattern 210' and a first trench 191' may be substantially the same as the isolation pattern 210 and the first trench 191 that are illustrated in and discussed with respect to FIG. 2B. For example, the first isolation pattern 210' may include a dielectric isolation pattern 211, a conductive isolation pattern 215, and a capping pattern 217. In contrast, the first isolation pattern 210' may have a top surface at a lower level than a first surface 100a of the substrate 100.

The second isolation pattern 210A' may be provided in the substrate 100 between the first and second photoelectric conversion regions PD1 and PD2. A backside trench 191A' and the second isolation pattern 210A' may be substantially the same as the backside trench 191A and the isolation pattern 210A that are illustrated in and discussed with respect to FIG. 4A. In contrast to FIG. 4A, the second isolation pattern 210A' may be disposed on the first isolation pattern 210'. The first and second isolation patterns 210' and 210A' may be connected to each other. For example, the second isolation pattern 210A' may have a bottom surface in contact with a top surface of the first isolation pattern 210'. Therefore, the first and second isolation patterns 210' and 210A' may define first and second pixel regions PX1 and PX2.

Figure 4C:
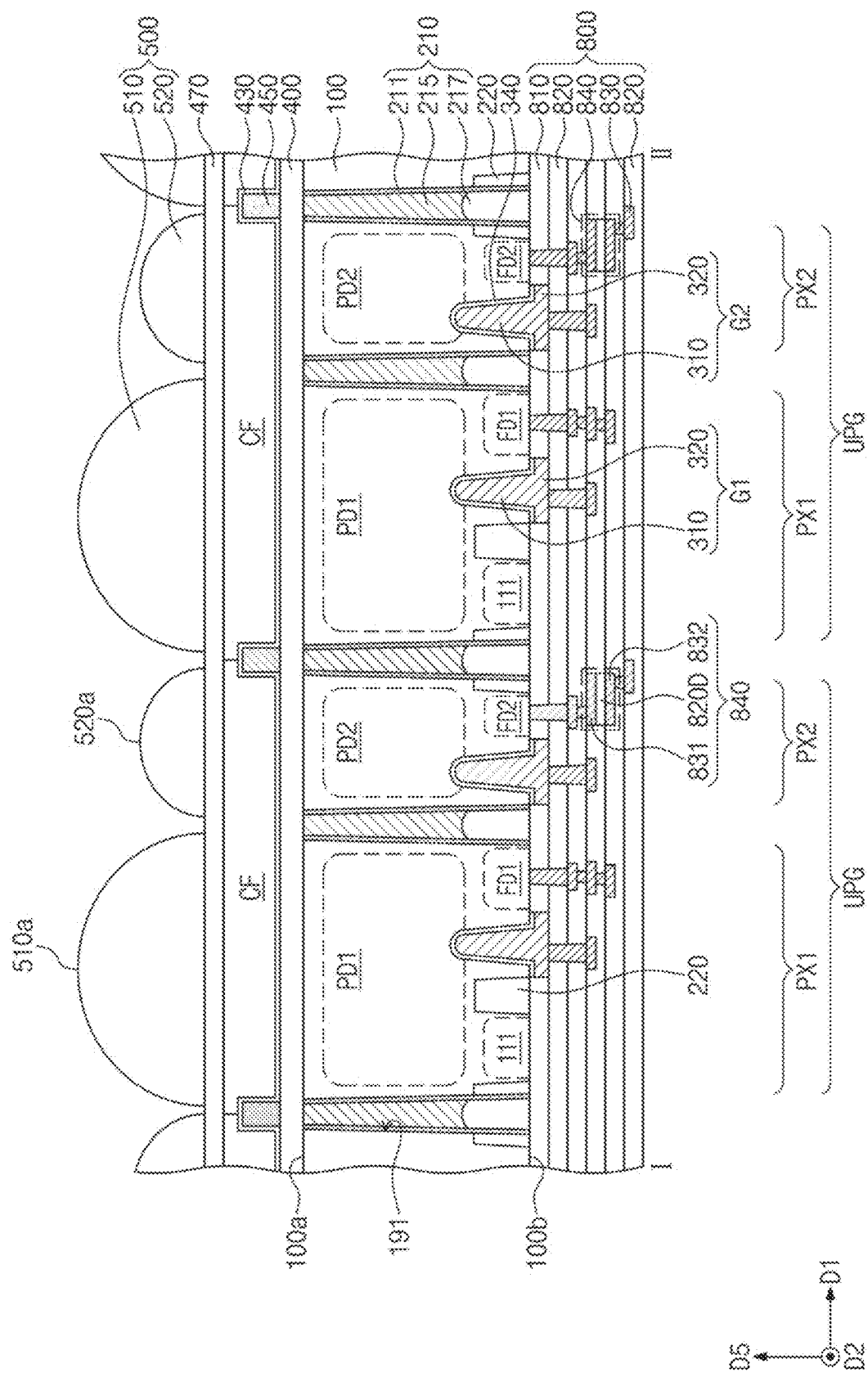
FIG. 4C illustrates a cross-sectional view showing an image sensor according to some example embodiments.

FIG. 4C illustrates a cross-sectional view taken along line I-II of FIG. 2A, showing an image sensor according to some example embodiments.

Referring to FIG. 4C, an image sensor may include a substrate 100, an isolation pattern 210, a device isolation pattern 220, a first gate pattern G1, a second gate pattern G2, a wiring layer 800, a dielectric layer 400, a protective layer 430, a fence pattern 450, color filters CF, and a microlens layer 500.

The microlens layer 500 may include a first lens pattern 510 and a second lens pattern 520. The first and second lens patterns 510 and 520 may be substantially the same as the first and second lens patterns 510 and 520 discussed in the example of FIGS. 2A and 2B. In contrast to FIGS. 2A and 2B, the microlens layer 500 may omit the planarized layer 530 discussed with respect to FIG. 2B. The second lens pattern 520 may be laterally spaced apart from the first lens pattern 510.

The image sensor may further include a transparent protective layer 470. The transparent protective layer 470 may be interposed between the color filters CF and the microlens layer 500. The transparent protective layer 470 may include a dielectric material. The transparent protective layer 470 may have a top surface that is substantially flat.

According to various embodiments, a first lens pattern may have a top surface whose curvature is adjusted to allow a first photoelectric conversion region to receive an increased amount of incident light. Accordingly, an image sensor may increase in optical properties.

This detailed description of various embodiments should not be construed as limited to the embodiments set forth herein, and it is intended that the embodiments cover various combinations, modifications and variations without departing from the spirit and scope of the appended claims. The appended claims should be construed to include other embodiments not necessarily explicitly described above.

What is claimed is:

1. An image sensor comprising:
a substrate that has a first pixel region and a second pixel region;
a microlens layer on a first surface of the substrate; and
a color filter between the microlens layer and the first surface of the substrate,
a plurality of photoelectric conversion regions that are correspondingly in the first pixel region and the second pixel region of the substrate;
an isolation pattern provided in a first trench in the substrate and between the plurality of photoelectric conversion regions; and
a fence pattern interposed between and separating each two neighboring color filters,
wherein the microlens layer includes:
a first lens pattern on the first pixel region of the substrate; and
a second lens pattern on the second pixel region of the substrate,
wherein a width of the first pixel region is greater than a width of the second pixel region,
wherein a height of the first lens pattern is greater than a height of the second lens pattern,
wherein the first lens pattern has a curved surface,
wherein a maximum interval between the curved surface of the first lens pattern and the first surface of the substrate is about 2.5 times to about 3.5 times a first radius,
wherein the first radius is a radius of an imaginary circle that is formed by at least three points selected from points on the curved surface of the first lens pattern,
wherein the isolation pattern includes,
a dielectric isolation pattern provided along a sidewall of the first trench,
a conductive isolation pattern, wherein the dielectric isolation pattern is between the conductive isolation pattern and the substrate, and
a capping pattern under the conductive isolation pattern,
wherein the first lens pattern and the second lens pattern are between a neighboring two fence patterns, when viewed in plan view, and
wherein the dielectric isolation pattern has a refractive index that is less than a refractive index of the substrate.

2. The image sensor of claim 1, wherein the color filter vertically overlaps the first lens pattern and the second lens pattern.

3. The image sensor of claim 1, wherein
the first pixel region of the substrate has a planar octagonal shape, and
the second pixel region of the substrate has a planar shape different from the planar octagonal shape of the first pixel region.

4. The image sensor of claim 1, wherein the microlens layer further includes a planarized layer between the substrate and the first lens pattern and between the substrate and the second lens pattern,
wherein the first lens pattern and the second lens pattern are connected to the planarized layer.

5. The image sensor of claim 4, wherein a height of the planarized layer is about 0.8 times to about 1.5 times the height of the first lens pattern.

6. The image sensor of claim 1, wherein the second lens pattern has a curved surface,
wherein the height of the first lens pattern is about 30% to about 50% of a width of the first lens pattern,
wherein the width of the first lens pattern is a width at a level of a location where the curved surface of the first lens pattern meets the curved surface of the second lens pattern.

7. The image sensor of claim 1, wherein the height of the second lens pattern is about 20% to about 30% of the height of the first lens pattern.

8. An image sensor comprising:
a substrate that has a first pixel region and a second pixel region whose width is different from a width of the first pixel region;
a plurality of photoelectric conversion regions that are correspondingly in the first pixel region and the second pixel region of the substrate;
a microlens layer on a first surface of the substrate, the microlens layer covering the first pixel region and the second pixel region of the substrate;
a color filter between the microlens layer and the first surface of the substrate,
an isolation pattern provided in a first trench in the substrate and between the plurality of photoelectric conversion regions; and
a fence pattern interposed between and separating each two neighboring color filters, wherein the microlens layer includes:
  a first lens pattern on the first pixel region of the substrate, the first lens pattern having a first curved surface; and
  a second lens pattern on the second pixel region of the substrate, the second lens pattern having a second curved surface,
wherein, at a level of a location where the first curved surface meets the second curved surface, a width of the first lens pattern is greater than a width of the second lens pattern,
wherein a height of the first lens pattern is greater than a height of the second lens pattern,
wherein a maximum interval between the first curved surface of the first lens pattern and the first surface of the substrate is about 2.5 times to about 3.5 times a first radius,
wherein the first radius is a radius of an imaginary circle that is formed by at least three points selected from points on the first curved surface of the first lens pattern,
wherein the isolation pattern includes:
  a dielectric isolation pattern provided along a sidewall of the first trench,
  a conductive isolation pattern, wherein the dielectric isolation pattern is between the conductive isolation pattern and the substrate, and
  a capping pattern under the conductive isolation pattern,
wherein the first lens pattern and the second lens pattern are between a neighboring two fence patterns, when viewed in plan view, and
wherein the dielectric isolation pattern has a refractive index that is less than a refractive index of the substrate.

9. The image sensor of claim 8, wherein the first lens pattern and the second lens pattern are on the color filter.

10. The image sensor of claim 8, wherein
the first pixel region of the substrate has an octagonal shape when viewed in plan view, and
the second pixel region of the substrate has a tetragonal shape when viewed in plan view.

11. The image sensor of claim 8, wherein the width of the second lens pattern is about 30% to about 50% of the width of the first lens pattern.

12. The image sensor of claim 8, wherein the substrate includes:
a first floating diffusion region on the first pixel region of the substrate; and
a second floating diffusion region on the second pixel region of the substrate.

13. The image sensor of claim 8, wherein the microlens layer further includes a planarized layer between the substrate and the first lens pattern and between the substrate and the second lens pattern,
wherein the planarized layer is connected to the first lens pattern and the second lens pattern.

14. An image sensor comprising:
a substrate that has a first pixel region and a second pixel region;
a plurality of photoelectric conversion regions that are correspondingly in the first pixel region and the second pixel region of the substrate;
an isolation pattern provided in a first trench in the substrate and between the plurality of photoelectric conversion regions;
a color filter on a first surface of the substrate;
a fence pattern interposed between and separating each two neighboring color filters;
a microlens layer on the color filter;
a first gate pattern on the first pixel region of the substrate and on a second surface of the substrate;
a second gate pattern on the second pixel region of the substrate and on the second surface of the substrate; and
a wiring layer on the second surface of the substrate, the wiring layer covering the first gate pattern and the second gate pattern,
wherein the substrate includes:
  a first floating diffusion region on the first pixel region of the substrate; and
  a second floating diffusion region on the second pixel region of the substrate,
wherein the microlens layer includes:
  a first lens pattern on the first pixel region of the substrate;
  a second lens pattern on the second pixel region of the substrate; and
  a planarized layer between the color filter and the first lens pattern and between the color filter and the second lens pattern,
wherein the first lens pattern and the second lens pattern are on the color filter,
wherein a width of the first pixel region is greater than a width of the second pixel region,
wherein a height of the first lens pattern is greater than a height of the second lens pattern,
wherein the first lens pattern has a curved surface,
wherein a maximum interval between the curved surface of the first lens pattern and the first surface of the substrate is about 2.5 to 3.5 times a first radius,
wherein the first radius is a radius of an imaginary circle that is formed by at least three points selected from points on the curved surface of the first lens pattern,
wherein the isolation pattern includes:
  a dielectric isolation pattern provided along a sidewall of the first trench,
  a conductive isolation pattern, wherein the dielectric isolation pattern is between the conductive isolation pattern and the substrate, and
  a capping pattern under the conductive isolation pattern,
wherein the first lens pattern and the second lens pattern are between a neighboring two fence patterns, when viewed in plan view, and
wherein the dielectric isolation pattern has a refractive index that is less than a refractive index of the substrate.

15. The image sensor of claim 14, wherein the first lens pattern has a first curved surface and the second lens pattern has a second curved surface,
at a level of a location where the first curved surface meets the second curved surface, a width of the second lens pattern is about 30% to about 50% of a width of the first lens pattern,
the height of the second lens pattern is about 20% to about 30% of the height of the first lens pattern,
the height of the first lens pattern is about 30% to about 50% of the width of the first lens pattern, and
a height of the planarized layer is about 0.8 times to about 1.5 times the height of the first lens pattern.

16. The image sensor of claim 14, wherein
the first lens pattern includes a plurality of first lens patterns,
the second lens pattern includes a plurality of second lens patterns,
when viewed in plan view in a first direction, the plurality of second lens patterns are correspondingly between the plurality of first lens patterns,
when viewed in plan view in a second direction, the plurality of second lens patterns are correspondingly between the plurality of first lens patterns, and
the second direction intersects the first direction.

\* \* \* \* \*